US010641846B2

(12) United States Patent
Tramm et al.

(10) Patent No.: US 10,641,846 B2
(45) Date of Patent: *May 5, 2020

(54) APPARATUS AND METHOD FOR MULTI-PART BODY COIL

(71) Applicant: Life Services LLC, Minneapolis, MN (US)

(72) Inventors: Brandon J. Tramm, Maple Grove, MN (US); Charles A. Lemaire, Apple Valley, MN (US); Matthew T. Waks, Coon Rapids, MN (US); Scott M. Schillak, Minneapolis, MN (US)

(73) Assignee: Life Services LLC, Minneapolis, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/422,355

(22) Filed: May 24, 2019

(65) Prior Publication Data

US 2019/0353721 A1    Nov. 21, 2019

Related U.S. Application Data

(62) Division of application No. 15/405,302, filed on Jan. 12, 2017, now Pat. No. 10,324,146.

(60) Provisional application No. 62/277,956, filed on Jan. 12, 2016.

(51) Int. Cl.
*G01V 3/00* (2006.01)
*G01R 33/3415* (2006.01)
*G01R 33/34* (2006.01)
*G01R 33/36* (2006.01)
*G01R 33/345* (2006.01)

(52) U.S. Cl.
CPC ...... *G01R 33/3415* (2013.01); *G01R 33/3403* (2013.01); *G01R 33/34007* (2013.01); *G01R 33/3453* (2013.01); *G01R 33/3614* (2013.01); *G01R 33/3628* (2013.01); *G01R 33/34046* (2013.01)

(58) Field of Classification Search
USPC ........................................................ 324/322
See application file for complete search history.

(56) References Cited

U.S. PATENT DOCUMENTS 10,324,146 B2 *  6/2019  Tramm .............. G01R 33/3628

* cited by examiner

*Primary Examiner* — Rodney E Fuller
(74) *Attorney, Agent, or Firm* — Charles A. Lemaire; Lemaire Patent Law Firm

(57) ABSTRACT

A method and apparatus for receiving (RX) radio-frequency (RF) signals suitable for MRI and/or MRS from a plurality of MRI "coil elements" (antennae), each contained in one or a plurality of body-coil parts, wherein the body-coil parts are easily assemble-able into a body-coil assembly (e.g., in some embodiments, a cylindrical body-coil assembly) with shield elements that are overlapped and/or concentric, and wherein the body-coil assembly is readily disassemble-able for easier shipping, and wherein the body-coil parts are optionally usable individually as transmit (TX) and/or receive (RX) coil elements for MRI. In some embodiments, the system provides for repeatable assembly and disassembly for ease of maintenance (such as frequency tuning and impedance matching) such that the body-coil assembly can be fully assembled and tested, then taken apart for less costly and easier shipping (with reduced risk of damage) and then reassembled at the destination for operation in an MRI system.

32 Claims, 12 Drawing Sheets

APPARATUS AND METHOD FOR MULTI-PART BODY COIL

CROSS-REFERENCE TO RELATED APPLICATIONS

This application is a divisional of U.S. patent application Ser. No. 15/405,302 filed Jan. 12, 2017 by Brandon J. Tramm et al. and titled "Method and apparatus for multi-part body coil" (which issued as U.S. Pat. No. 10,324,146 on Jun. 18, 2019), which claims priority benefit, under 35 U.S.C. § 119(e), of U.S. Provisional Patent Application No. 62/277,956 filed Jan. 12, 2016 by Brandon J. Tramm et al., titled "Method and apparatus for multi-part body coil," each of which is incorporated herein by reference in its entirety.

FIELD OF THE INVENTION

This invention relates to the field of magnetic-resonance imaging (MRI) and magnetic-resonance spectroscopy (MRS), and more specifically to a method and apparatus for transmitting (TX) and receiving (RX) radio-frequency (RF) signals suitable for MRI and/or MRS from MRI "coil elements" (antennae), each contained in one or a plurality of body-coil portions, wherein the body-coil portions are easily assemble-able into a body-coil assembly (e.g., in some embodiments, a cylindrical body-coil assembly) with shield elements that are overlapped and/or concentric, and wherein the body-coil assembly is readily disassemble-able for easier shipping, and wherein the body-coil portions are optionally usable individually as transmit (TX) and/or receive (RX) coil elements for MRI.

BACKGROUND OF THE INVENTION

U.S. Pat. No. 6,605,775 to Seeber et al. issued Aug. 12, 2003 with the title "Floating radio frequency trap for shield currents" and is incorporated herein by reference. In U.S. Pat. No. 6,605,775, Seeber et al. describe a floating shield current trap that provides first and second concentric tubular conductors electrically connected to provide a resonance-induced high impedance of current flow in a path consisting of the inner and outer conductors and their junctions thereby suppressing coupled current flow on a shield of a conductor contained within the first inner tubular conductor.

U.S. Pat. No. 6,664,465 to Seeber issued Dec. 16, 2003 with the title "Tuning system for floating radio frequency trap" and is incorporated herein by reference. In U.S. Pat. No. 6,664,465, Seeber describes a floating shield current trap provides two resonance loops formed of split concentric tubular conductors joined radially at their axial ends. Adjustment of the separation of these loops provides a change in coupling between the loops effecting a simplified tuning of the resonance of the trap for different expected frequencies of interfering shield current.

U.S. Pat. No. 6,593,744 to Burl et al. issued Jul. 15, 2003 with the title "Multi-channel RF cable trap for magnetic resonance apparatus" and is incorporated herein by reference. In U.S. Pat. No. 6,593,744, Burl et al. describe a multi-channel RF cable trap that blocks stray RF current from flowing on shield conductors of coaxial RF cables of a magnetic resonance apparatus. An inductor is formed by a curved semi-rigid trough constructed of an insulating material coated with an electrically conducting layer. Preferably, the inductor and the cable follow an "S"-shaped path to facilitate good electromagnetic coupling. The RF cables are laid in the trough and the shield conductors inductively couple with the inductor. A capacitor and optional trim capacitor are connected across the trough of the inductor to form a resonant LC circuit tuned to the resonance frequency. The LC circuit inductively couples with the shield conductors to present a signal-attenuating high impedance at the resonance frequency. The resonant circuit is preferably contained in an RF-shielding box with removable lid.

Low-power circuits can use varactors (electrically variable capacitors), field-effect transistors (used as variable gain elements or variable resistors) and like components that are directly electrically-adjustable, for use in adjusting frequency, impedance or other circuit characteristics and parameters, however such components are often unsuitable or inoperative in high fields.

U.S. Pat. No. 6,495,069 issued Dec. 17, 2002 to Lussey et al. with the title "Polymer composition" and is incorporated herein by reference. In U.S. Pat. No. 6,495,069, Lussey et al. describe a polymer composition comprises at least one substantially non-conductive polymer and at least one electrically conductive filler and in the form of granules. Their elastomer material was proposed for devices for controlling or switching electric current, to avoid or limit disadvantages such as the generation of transients and sparks which are associated with the actuation of conventional mechanical switches. They described an electrical conductor composite providing conduction when subjected to mechanical stress or electrostatic charge but electrically insulating when quiescent comprising a granular composition each granule of which comprises at least one substantially non-conductive polymer and at least one electrically conductive filler and is electrically insulating when quiescent but conductive when subjected to mechanical stress. They did not propose a means for electrically activating such switches.

U.S. Pat. No. 8,299,681 to Snyder, Vaughan and Lemaire issued Oct. 30, 2012 with the title "Remotely adjustable reactive and resistive electrical elements and method" and is incorporated herein by reference. In U.S. Pat. No. 8,299,681, Snyder, Vaughan and Lemaire describe an apparatus and method that includes providing a variable-parameter electrical component in a high-field environment and based on an electrical signal, automatically moving a movable portion of the electrical component in relation to another portion of the electrical component to vary at least one of its parameters. In some embodiments, the moving uses a mechanical movement device (e.g., a linear positioner, rotary motor, or pump). In some embodiments of the method, the electrical component has a variable inductance, capacitance, and/or resistance. Some embodiments include using a computer that controls the moving of the movable portion of the electrical component in order to vary an electrical parameter of the electrical component. Some embodiments include using a feedback signal to provide feedback control in order to adjust and/or maintain the electrical parameter. Some embodiments include a non-magnetic positioner connected to an electrical component configured to have its RLC parameters varied by the positioner.

U.S. Patent Application Publication No. 2010/0253348 by Wiggins published Oct. 7, 2010 with the title "Radio Frequency Coil Arrangement for High Field Magnetic Resonance Imaging with Optimized Transmit and Receive Efficiency for a Specified Region of Interest, and Related System and Method," and is incorporated herein by reference. In the application 2010/0253348, Wiggins describes exemplary embodiments of a coil arrangement that can include, e.g., a plurality of elements which can be provided at an angle from one another. The angle can be selected to effectuate an imaging of a target region of interest at least one of a predetermined depth or range of depths, for example. In certain exemplary embodiments according to the present disclosure, the angle can be selected to effectuate an exemplary predetermined transmit efficiency for at least one of the elements. Additionally, the exemplary angle can be selected to effectuate a predetermined receive sensitivity for at least one of the elements. Further, according to certain exemplary embodiments of a coil arrangement in according to the present disclosure, the angle can be adjusted manually and/or automatically.

A journal article, "96-Channel Receive-Only Head Coil for 3 Tesla: Design Optimization and Evaluation" by Graham C. Wiggins et al. (Magn. Reson. Med. 2009 September; 62(3): 754-762. doi:10.1002/mrm.22028) describes a receive coil, and is incorporated herein by reference.

U.S. Pat. No. 4,885,539 to Roemer et al. issued Dec. 5, 1989 with the title "Volume NMR coil for optimum signal-to-noise ratio" and is incorporated herein by reference. In U.S. Pat. No. 4,885,539, Roemer et al. describe an RF volume coil with optimized signal-to-noise ratio, for NMR use, has a reduced length $L_c$, which is between about $0.3r_s$ and about $1.5r_s$, where $r_s$ is the radius of a sample-to-be-investigated, contained within the cylindrical volume coil, with the volume coil radius $r_c$ being between about $1.0r_s$ and about $1.6r_s$ the "short" volume coil has an improved SNR for a voxel located substantially on the central plane of the coil, relative to the SNR of a "normal"-length volume coil with $L_c$ greater or equal to $4r_s$.

A journal article, "The NMR Phased Array" by P. B. Roemer et al. (Magn. Reson. Med. 1990 November; Vol. 16 Issue 262 pages 192-225) describes a phased array receive coil, and is incorporated herein by reference. Roemer et al. describe ways to overlap coil loops (circular loops overlapped by spacing the centers of the circular loops at 0.75 diameter, and square loops by about 0.9 diameter; and the loops are all the same size) to reduce mutual-induction interference.

U.S. Pat. No. 6,534,983 to Boskamp et al. issued Mar. 18, 2003 with the title "Multi-channel phased array coils having minimum mutual inductance for magnetic resonance systems" and is incorporated herein by reference. In U.S. Pat. No. 6,534,983, Boskamp et al. describe a multi-channel phased array coil for use in a magnetic resonance (MR) system is disclosed herein. The phased array coil includes N coils configured in an array, each of the N coils having a geometric shape and overlapping with (N−1) coils to form an overlap area within the array. The geometric shape of each of the coils and the overlap area are configured to cause a mutual inductance between every pair of the coils to be less than 10 percent of the self-inductance of each of the N coils. At least four coils are provided in the phased array coil.

U.S. Pat. No. 6,538,441 issued to Watkins et al. on Mar. 25, 2003 with the title "RF coil for reduced electric field exposure for use in very high field magnetic resonance imaging" and is incorporated herein by reference. In U.S. Pat. No. 6,538,441, Watkins et al. describe an RF coil assembly for a very high field Magnetic Resonance Imaging (MRI) system is provided. The RF coil assembly comprises a plurality of conductors arranged cylindrically and disposed about a patient bore tube of the MRI system. Each of the conductors is configured for the RF coil assembly to resonate at substantially high frequencies. Further, the RF coil assembly comprises a plurality of capacitive elements disposed between and connecting respective ends of the conductors and further disposed in a spaced-apart relationship with the patient bore tube. The capacitive elements are for electrically interconnecting the plurality of conductors at the respective ends of the conductors.

U.S. Pat. No. 6,822,448 issued to Watkins et al. on Nov. 23, 2004 with the title "RF coil for very high field magnetic resonance" and is incorporated herein by reference. In U.S. Pat. No. 6,822,448, Watkins et al. describe an RF coil assembly for a very high field Magnetic Resonance Imaging (MRI) system is provided comprising a plurality of conductors arranged cylindrically and disposed about a cylindrical patient bore tube of the MRI system and a plurality of capacitive elements for electrically interconnecting the plurality of conductors at respective ends of the conductors. The conductors have a width selected for the RF coil assembly to resonate at substantially high frequencies. A very high field Magnetic Resonance Imaging (MRI) system is provided that comprises a RF coil assembly adapted to resonate at substantially high frequencies, a RF coil shield assembly and a plurality of RF drive power cables.

U.S. Patent Application Publication 2007/0236490 of Casteele et al. published on Oct. 11, 2007 with the title "Medical image display and review system" and is incorporated herein by reference. This publication 2007/0236490 describes an image display and review system for display of medical images represented by a digital image data set wherein a pre-defined number of viewports for display of different image representations is provided and wherein at least some of these viewports are configured to enable sequential display of different image representations deduced from the digital image data set.

U.S. Patent Application Publication 2013/0106416 of Morich et al. published on May 2, 2013 with the title "Router and coil array for ultra high field MRI", and is incorporated herein by reference. This publication 2013/0106416 describes a router for use with magnetic resonance systems that selectively routes unique excitation signals generated by a multi-channel radio-frequency (RF) amplifier over transmission lines (Tx) to any one of a plurality of connection panels which each accepts at least one RF coil assembly having multiple coil elements. Each connection panel includes transceiver ports for connecting at least one conductor of the coil elements to a corresponding transceiver channel (T/R). The router selectively routes magnetic resonance signals received by the conductors from the transceiver channels (T/R) to a multi-channel RF receiver. The "coin" (coil) elements may carry sine-mode currents or uniform currents.

U.S. Pat. No. 8,854,042 by Vaughan and Lemaire titled "Method and coils for human whole-body imaging at 7 T," issued Oct. 7, 2014 and claims priority benefit, under 35 U.S.C. § 119(e), of U.S. Provisional Patent Application No. 61/371,170, filed on Aug. 5, 2010 and titled "Coils for human whole-body imaging at 7T," each of which is incorporated herein by reference in its entirety. A progressive series of five new coils is described. The first coil solves problems of transmit-field inefficiency and inhomogeneity for heart and body imaging, with a close-fitting, 16-channel TEM conformal array design with efficient shield-capacitance decoupling. The second coil progresses directly from the first with automatic tuning and matching, an innovation of huge importance for multi-channel transmit coils. The third coil combines the second, auto-tuned multi-channel transmitter with a 32-channel receiver for best transmit-efficiency, control, receive-sensitivity and parallel-imaging performance. The final two coils extend the innovative technology of the first three coils to multi-nuclear ($^{31}$P-$^{1}$H) designs to make practical human-cardiac imaging and spectroscopy possible for the first time at 7 T.

U.S. Pat. No. 8,217,653 by Vaughan issued Jul. 10, 2012, titled "Multi-channel RF coil system with multi-channel RF coil transceiver detecting more than one frequency at the same time for magnetic resonance imaging systems and methods," and is incorporated herein by reference. This U.S. Pat. No. 8,217,653 describes an RF coil system for magnetic resonance applications that includes a multi-channel RF coil transceiver and a multi-channel RF coil. The RF coil system is structured for reconfiguration among a plurality of operational modes.

U.S. Pat. No. 8,193,809 by Akgun et al. issued Jun. 5, 2012 with the title "Three dimensional RF coil structures for field profiling" and is incorporated herein by reference. This U.S. Pat. No. 8,193,809 describes a radio frequency (RF) that include a plurality of transmission line elements, wherein at least one of the plurality of transmission line elements may have at least one dimension different than a dimension of another one of the plurality of transmission line elements. In some cases, each of the transmission line elements may include a signal line conductor and a ground plane conductor separated by a dielectric.

U.S. Pat. No. 8,380,266 by Vaughan et al. issued Feb. 19, 2013 with the title "Coil element decoupling for MRI" and is incorporated herein by reference. This U.S. Pat. No. 8,380,266 describes an RF coil adjacent an imaging region includes a plurality of conducting coil elements, with each conducting coil element including a proximal portion and a distal portion. The RF coil also includes a capacitance between the distal portions of the at least two conducting coil elements. A mutual coupling inductance between at least two conducting coil elements of the plurality of conducting coil elements is substantially cancelled by the capacitance between the distal portions of the at least two conducting coil elements.

U.S. Pat. No. 7,268,554 issued to Vaughan on Sep. 11, 2007, titled "RF coil for imaging system," is incorporated herein by reference. In this U.S. Pat. No. 7,268,554, an RF coil suitable for use in imaging systems is described, which coil has a dielectric filled cavity formed by a surrounding conducting enclosure, the conducting enclosure preferably being patterned to form continuous electrical paths around the cavity, each of which paths may be tuned to a selected resonant frequency. The patterning breaks up any currents induced in the coil and shortens path lengths to permit higher frequency, and thus higher field strength operation. The invention also includes improved mechanisms for tuning the resonant frequency of the paths, for selectively detuning the paths, for applying signal to the coil, for shortening the length of the coil and for controlling the field profile of the coil and the delivery of field to the object to the image.

U.S. Pat. No. 6,633,161 issued to Vaughan, Jr. on Oct. 14, 2003, titled "RF coil for imaging system," is incorporated herein by reference. In this U.S. Pat. No. 6,633,161, an RF coil suitable for use in imaging systems is provided which coil has a dielectric filled cavity formed by a surrounding conducting enclosure, the conducting enclosure preferably being patterned to form continuous electrical paths around the cavity, each of which paths may be tuned to a selected resonant frequency. The patterning breaks up any currents induced in the coil and shortens path lengths to permit higher frequency, and thus higher field strength operation. The invention also includes improved mechanisms for tuning the resonant frequency of the paths, for selectively detuning the paths, for applying signal to the coil, for shortening the length of the coil and for controlling the field profile of the coil and the delivery of field to the object to the image.

U.S. Pat. No. 5,557,247 issued to Vaughan, Jr. on Sep. 17, 1996, titled "Radio frequency volume coils for imaging and spectroscopy," is incorporated herein by reference. This U.S. Pat. No. 5,557,247 describes a distributed impedance circuit MR coil design comprised of a transmission line tunable cavity resonator which is well suited for but not limited to use at high frequencies and for large volumes such as in high field (e.g., 4.1 Tesla) clinical MR applications. The distributed circuit transmission line resonator is designed for high frequency, large conductive volume applications where conventional lumped element coil designs fail. A resonant coaxial cavity is variably tuned to the Larmor frequency of interest by tunable transmission line elements. The resonator is effective for large head and body sized volumes, high efficiencies, and broad tuning ranges to frequencies of 500 MHz. The $B_1$ homogeneity of the resonator is a function of the electromagnetic properties of the load itself. Maxwell's equations for the fully time-dependent $B_1$ field predicts "coil" homogeneity with finite-element models of anatomic structure. Coil design and construction, and methods of quadrature driving and double tuning the transmission line resonator, are set forth.

U.S. Pat. No. 5,744,957 issued to Vaughan, Jr. on Apr. 28, 1998, titled "Cavity resonator for NMR systems," is incorporated herein by reference. In this U.S. Pat. No. 5,744,957, a cavity resonator is disclosed for use in nuclear magnetic resonance (NMR) systems. The resonator has a housing defining a cavity having a selected length and cross-sectional shape. A layer of electrically conductive material is provided around at least a portion of the housing enclosing a dielectric material (air, gasses, Teflon®, etc.) and the cavity is energized at a Larmor radio frequency useful for NMR systems. The cavity, i.e., a volume enclosed by conductive walls, furthermore, is dimensioned to resonate at the selected radio frequency to thereby generate an alternating magnetic field through the cavity. An opening in the housing is adapted to be placed adjacent an object to be analyzed.

U.S. Pat. No. 5,886,596 issued to Vaughan, Jr. on Mar. 23, 1999, titled "Radio frequency volume coils for imaging and spectroscopy," is incorporated herein by reference. This U.S. Pat. No. 5,886,596 describes an electromagnetic shield for an NMR radio frequency coil designed to resonate at a selected Larmor frequency. The shield includes an electrically conductive layer surrounding the coil. This electrically conductive layer has a thickness substantially the same as one skin depth at the selected Larmor frequency. As such, the conductive layer efficiently conducts radio frequency currents at the selected Larmor frequency thereby conducting and containing the radio frequency coils at the selected Larmor frequency within the coil. Simultaneously, an electrically conductive layer, due to its thinness, very inefficiently conducts eddy currents of the type induced by the lower frequency DC gradient current switching transients the gradients are utilized to magnetically localize an image slice or volume. Consequently, the conductive layer simultaneously attenuates low frequency eddy current propagation of the type induced by the switching field gradient currents in the NMR application, and therefore does not substantially shield or affect the gradient fields across the coil.

U.S. Pat. No. 7,800,368 issued to Vaughan, et al. on Sep. 21, 2010, titled "High field magnetic resonance," is incorporated herein by reference. In this U.S. Pat. No. 7,800,368, a magnetic resonance system is disclosed. The system includes a transceiver having a multichannel receiver and a multichannel transmitter, where each channel of the transmitter is configured for independent selection of frequency, phase, time, space, and magnitude, and each channel of the receiver is configured for independent selection of space, time, frequency, phase and gain. The system also includes a magnetic resonance coil having a plurality of current elements, with each element coupled in one to one relation with a channel of the receiver and a channel of the transmitter. The system further includes a processor coupled to the transceiver, such that the processor is configured to execute instructions to control a current in each element and to perform a non-linear algorithm to shim the coil.

U.S. Pat. No. 6,788,056 issued to Vaughan, et al. on Sep. 7, 2004, titled "Radio frequency magnetic field unit with aperature [sic]," and is incorporated herein by reference. In this U.S. Pat. No. 6,788,056, Vaughan et al. describe an apparatus comprises a radio frequency magnetic field unit to generate a desired magnetic field. In one embodiment, the radio frequency magnetic field unit includes a first aperture that is substantially unobstructed and a second aperture contiguous to the first aperture. In an alternative embodiment, the radio frequency magnetic field unit includes a first side aperture, a second side aperture and one or more end apertures. In one embodiment of a method, a current element is removed from a radio frequency magnetic field unit to form a magnetic field unit having an aperture. In an alternative embodiment, two current elements located opposite from one another in a radio frequency magnetic field unit are removed to form a magnetic field unit having a first side aperture and a second side aperture.

U.S. Pat. No. 6,958,607 issued to Vaughan, et al. on Oct. 25, 2005, titled "Assymetric [sic] radio frequency transmission line array," is incorporated herein by reference. In this U.S. Pat. No. 6,958,607, Vaughan et al. describe an apparatus comprises a radio frequency magnetic field unit to generate a desired magnetic field. In one embodiment, the radio frequency magnetic field unit includes a first aperture that is substantially unobstructed and a second aperture contiguous to the first aperture. In an alternative embodiment, the radio frequency magnetic field unit includes a first side aperture, a second side aperture and one or more end apertures. In one embodiment of a method, a current element is removed from a radio frequency magnetic field unit to form a magnetic field unit having an aperture. In an alternative embodiment, two current elements located opposite from one another in a radio frequency magnetic field unit are removed to form a magnetic field unit having a first side aperture and a second side aperture.

U.S. Pat. No. 7,023,209 issued to Zhang, et al. on Apr. 4, 2006 titled "Method and apparatus for magnetic resonance imaging and spectroscopy using microstrip transmission line coils," and is incorporated herein by reference. In this U.S. Pat. No. 7,023,209, Zhang et al. describe an apparatus and method for MRI imaging using a coil constructed of microstrip transmission line (MTL coil) are disclosed. In one method, a target is positioned to be imaged within the field of a main magnetic field of a magnet resonance imaging (MRI) system, a MTL coil is positioned proximate the target, and a MRI image is obtained using the main magnet and the MTL coil. In another embodiment, the MRI coil is used for spectroscopy. MRI imaging and spectroscopy coils are formed using microstrip transmission line. These MTL coils have the advantageous property of good performance while occupying a relatively small space, thus allowing MTL coils to be used inside restricted areas more easily than some other prior art coils. In addition, the MTL coils are relatively simple to construct of inexpensive components and thus relatively inexpensive compared to other designs. Further, the MTL coils of the present invention can be readily formed in a wide variety of coil configurations, and used in a wide variety of ways. Further, while the MTL coils of the present invention work well at high field strengths and frequencies, they also work at low frequencies and in low field strengths as well.

U.S. Pat. No. 6,969,992 issued to Vaughan, et al. on Nov. 29, 2005, titled "Parallel transceiver for nuclear magnetic resonance system," is incorporated herein by reference. This U.S. Pat. No. 6,969,992 describes an excitation and detection circuit having individually controllable elements for use with a multi-element radio frequency coil. Characteristics of the driving signal, including, for example, the phase, amplitude, frequency and timing, from each element of the circuit is separately controllable using small signals. Negative feedback for the driving signal associated with each coil element is derived from a receiver coupled to that coil element.

U.S. Pat. No. 7,710,117 issued to Vaughan, et al. on May 4, 2010, titled "Multi-current elements for magnetic resonance radio frequency coils," is incorporated herein by reference. This U.S. Pat. No. 7,710,117 describes a current unit having two or more current paths that allow control of magnitude, phase, time, frequency and position of each of element in a radio frequency coil. For each current element, the current can be adjusted as to a phase angle, frequency and magnitude. Multiple current paths of a current unit can be used for targeting multiple spatial domains or strategic combinations of the fields generated/detected by combination of elements for targeting a single domain in magnitude, phase, time, space and frequency.

U.S. Pat. No. 7,514,926 issued to Adriany, et al. on Apr. 7, 2009, titled "Spatially reconfigurable magnetic resonance coil," is incorporated herein by reference. This U.S. Pat. No. 7,514,926 discusses, among other things, a system and method for a coil having a plurality of resonant elements and an adjustable frame. A position of at least one resonant element can be adjusted relative to at least one other resonant element. A variable impedance is coupled to adjacent resonant elements and the impedance varies as a function of a separation distance. Cables are coupled to each resonant element and are gathered at a junction in a particular manner.

U.S. Pat. No. 7,598,739 issued to Vaughan, Jr., et al. on Oct. 6, 2009, titled "Radio frequency gradient, shim and parallel imaging coil," is incorporated herein by reference. This U.S. Pat. No. 7,598,739 describes a plurality of linear current elements that are configured about a specimen to be imaged. A current in each current element is controlled independent of a current in other current elements to select a gradient and to provide radio frequency shimming. Each current element is driven by a separate channel of a transmitter and connected to a separate channel of a multichannel receiver. The impedance, and therefore, the current, in each current element is controlled mechanically or electrically.

U.S. Pat. No. 7,633,293 issued to Olson, et al. on Dec. 15, 2009, titled "Radio frequency field localization for magnetic resonance," is incorporated herein by reference. This U.S. Pat. No. 7,633,293 describes that technology for controlling non-uniformity in the $B_1$ field includes selecting the phase, magnitude, frequency, time, or spatial relationship among various elements of a multi-channel excitation coil in order to control the radio frequency (RF) power emanating from the coil antenna elements. Non-uniformity can be used to steer a constructively interfering $B_1$ field node to spatially correlate with an anatomic region of interest. A convex (quadratically constrained quadratic problem) formulation of the $B_1$ localization problem can be used to select parameters for exciting the coil. Localization can be used in simulated Finite Difference Time Domain $B_1$ field human head distributions and human head phantom measurement.

U.S. Patent Publication 2015/0323624 (application Ser. No. 14/619,051), filed Feb. 10, 2015 by Feinberg and Schillak titled "Device and method for loops-over-loops MRI coils" is incorporated by reference. Publication 2015/0323624 describes a method and apparatus for receiving (RX) radio-frequency (RF) signals suitable for MRI and/or MRS from MRI "coil loops" (antennae) that are overlapped and/or concentric, and each of which has a preamplifier and frequency-tuning circuitry and an impedance-matching circuitry, but wherein the loops optionally sized differently and/or located at different elevations (distances from the patient's tissue) in order to extract signal from otherwise cross-coupled coil loops and to improve signal-to-noise ratio (SNR) in images made from the received signal.

U.S. Patent Publication 2015/0196226 (application Ser. No. 14/548,276), filed Nov. 11, 2014 by Tramm et al. titled "Method and positionable patient-interface apparatus for an MRI system," which claims priority to U.S. Provisional Patent Application No. 61/906,409 filed Nov. 19, 2013 titled "Method and apparatus for adjustable earpieces in an MRI system," are each incorporated herein by reference in their entirety. Publication 2015/0196226 describes an apparatus and method for imaging a patient in an MRI system. This includes a frame, and at least one assembly that includes a patient-interface positioner connected to a reference position on the frame, a first lockable joint on the positioner; and a patient interface connected to a patient-proximal end of the positioner by a second joint, wherein the first patient-interface is moveably positioned to a selected pitch angle, a selected yaw angle, and a selected one of a plurality of distances relative to the reference position on the frame. The first lockable joint is configured to be tightened to yieldably hold the first patient-interface at the selected pitch and yaw angles, and at the selected one of the plurality of distances, relative to the reference position. Optionally a second substantially similar patient-interface and assembly are provided. The earpiece(s) optionally include audio transducer(s) and/or RF coil(s).

U.S. Pat. No. 9,160,295 to Waks et al. issued Oct. 13, 2015 with the title "Snap-on coaxial cable balun and method for trapping RF current on outside shield of coax after installation" and is incorporated herein by reference. Waks et al. describe an apparatus and method for a radially attachable RF trap attached from a side to a shielded RF cable. In some embodiments, the RF trap creates a high impedance on the outer shield of the RF cable at a frequency of RF signals carried on at least one inner conductor of the cable. In some embodiments, an RF-trap apparatus for blocking stray signals on a shielded RF cable that has a peripheral shield conductor and an inner conductor for carrying RF signals includes: a case; an LC circuit having a resonance frequency equal to RF signals carried on the inner conductor; projections that pierce and connect the LC circuit to the shield conductor; and an attachment device that holds the case to the cable with the LC circuit electrically connected to the shield conductor of the shielded RF cable.

There is a long-felt need for an improved body coil for an MRI system.

SUMMARY OF THE INVENTION

A method and apparatus for receiving (RX) radio-frequency (RF) signals suitable for MRI and/or MRS from a plurality of MRI "coil elements" (antennae), each contained in one or a plurality of body-coil portions, wherein the body-coil portions are easily assemble-able into a body-coil assembly (e.g., in some embodiments, a cylindrical body-coil assembly) with, in some embodiments, shield elements that are overlapped and/or concentric, and wherein, in some embodiments, the body-coil assembly is readily disassemble-able for easier shipping, and wherein the body-coil portions/parts are optionally usable individually as a set of one or more transmit (TX) and/or receive (RX) coil elements for MRI. In some embodiments, the system provides for repeatable assembly and disassembly for ease of maintenance (such as frequency tuning and impedance matching) such that the body-coil assembly can be fully assembled and tested, then taken apart for less costly and easier shipping (with reduced risk of damage) and then reassembled at the destination for operation in an MRI system.

In some embodiments, the assembled body coil of the present invention is configured as a circularly polarized transverse-electric-magnetic (TEM) coil such as those described in patents listed in the Background section of this document. In other embodiments, the assembled body coil of the present invention is configured as a birdcage coil that is electrically similar to a conventional birdcage coil but with the improved body-coil portions that can be easily assembled into the cylindrical operating shape, and also disassembled into individual body-coil portions for maintenance, testing, tuning and/or shipping, and then reassembled into the cylindrical operating shape. In some embodiments, preamplifiers and Tx-Rx switches are built into each of the body-coil portions. In some embodiments, one or more power amplifiers are also built into each of the body-coil portions. In some embodiments, each antenna element has one or more power amplifiers built into the frame of the respective body-coil portion. In some embodiments, the power amplifiers use the antenna element as heat sinks to dissipate heat from operation of the power amplifiers. In some embodiments, using a plurality of power amplifiers to synergistically drive a single antenna element simultaneously, each power amplifier can operate at lower voltages and lower powers. In other embodiments, a plurality of power amplifiers to synergistically drive a single antenna element sequentially, such that while one power amplifier is driving the antenna element, the other ones of the power amplifiers for that element are quiesced and allowed to cool.

DESCRIPTION OF PREFERRED EMBODIMENTS

Figure 1A:
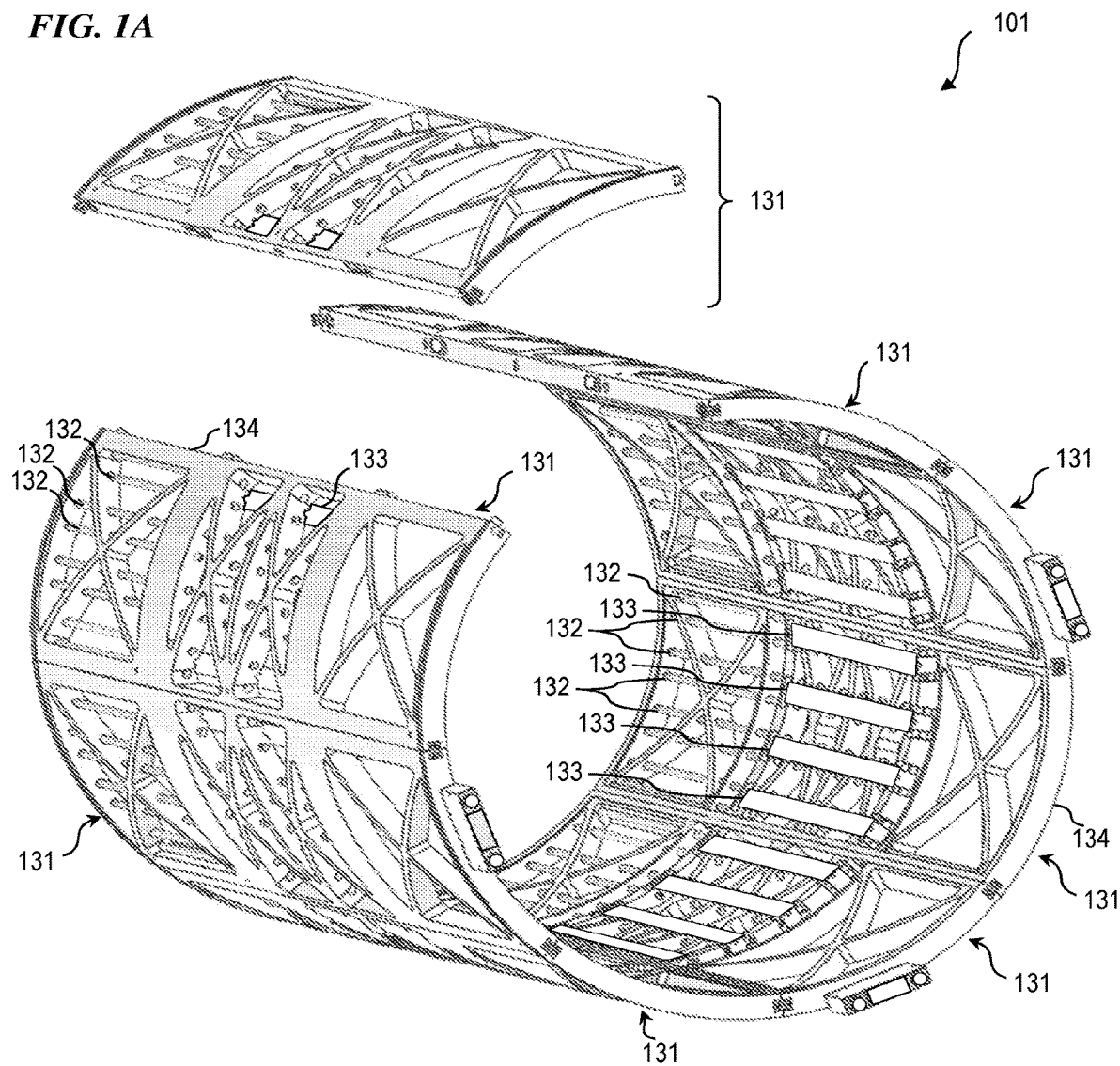
FIG. 1A is a perspective-view diagram of a body-coil system 101 in a partially assembled position and shown without the covers and shields, according to some embodiments of the present invention.

Although the following detailed description contains many specifics for the purpose of illustration, a person of ordinary skill in the art will appreciate that many variations and alterations to the following details are within the scope of the invention. Specific examples are used to illustrate particular embodiments; however, the invention described in the claims is not intended to be limited to only these examples, but rather includes the full scope of the attached claims. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

It is specifically contemplated that the present invention includes embodiments having combinations and subcombinations of the various embodiments and features that are individually described herein (i.e., rather than listing every combinatorial of the elements, this specification includes descriptions of representative embodiments and contemplates embodiments that include some of the features from one embodiment combined with some of the features of another embodiment, including embodiments that include some of the features from one embodiment combined with some of the features of embodiments described in the patents and application publications incorporated by reference in the present application). Further, some embodiments include fewer than all the components described as part of any one of the embodiments described herein.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

As used herein, a non-magnetic mechanical movement device is any electrically-controlled device (such as a linear positioner, rotary motor, or pump) made of materials that do not move (or move to a substantially negligible amount) due to a high magnetic field when subjected to the high magnetic field. Such devices can be placed within the high magnetic field of a magnetic-resonance machine or the superconducting magnet of a particle accelerator without the danger of the device moving due to the magnetic field and/or without the undesirable result of changing the magnetic field due to their presence. In many of the descriptions herein, the term "motor" (such as motor 140) will be used as an example of such a non-magnetic mechanical movement device, however one of skill in the art will recognize that in other embodiments, the "motor" can be implemented as a linear or rotary motor device using suitable linkages, or as a pump that uses a liquid or pneumatic fluid to effectuate the described movement.

In some embodiments, each unit 501 is implemented as described in one or more embodiments described in U.S. Patent Publication 2015/0196226, filed Nov. 11, 2014 by Tramm et al. titled "Method and positionable patient-interface apparatus for an MRI system," which is incorporated herein by reference.

FIG. 1A is a perspective-view diagram of a body-coil system 101 in a partially assembled position and shown without covers and shields, according to some embodiments of the present invention. In some embodiments, body-coil system 101 includes a plurality of body-coil portions 131 (each shown without the covers and shielding-parts that will be described below). In some embodiments, each body-coil portion 131 includes one or more RF antenna elements 133 (in this example, each body-coil portion 131 includes four RF antenna elements 133, however other embodiments within the invention have fewer or a greater number of RF antenna elements 133), wherein each RF antenna element 133 is operatively coupled to tune-and-match circuitry (used to adjust the resonance frequency to the desired frequency of the element (such as hydrogen, phosphorous, and/or other constituent component of the tissue being examined and/or imaged) and match the characteristic impedance to the cables and amplifiers that are coupled to drive a transmit signal or pre-amplify a received signal at the frequency being used). In some embodiments, adjustment rods 132 are used to adjust the tune-and-match electrical components, and in some such embodiments, these rods are driven by non-magnetic rotary or linear motors (e.g., in some embodiments, to adjust capacitances). In other embodiments, the tune-and-match circuitry has parameters (capacitance and/or inductance and/or resistance) that are electronically adjustable and feedback signals are analyzed (for frequency and impedance, for example) and the results of the analysis are used to perform automatic tuning and matching. In some embodiments, a frame (e.g., made of a non-magnetic, electrically-insulating dielectric) is used to mount the other components and the shielding and covers described below.

Figure 1B:
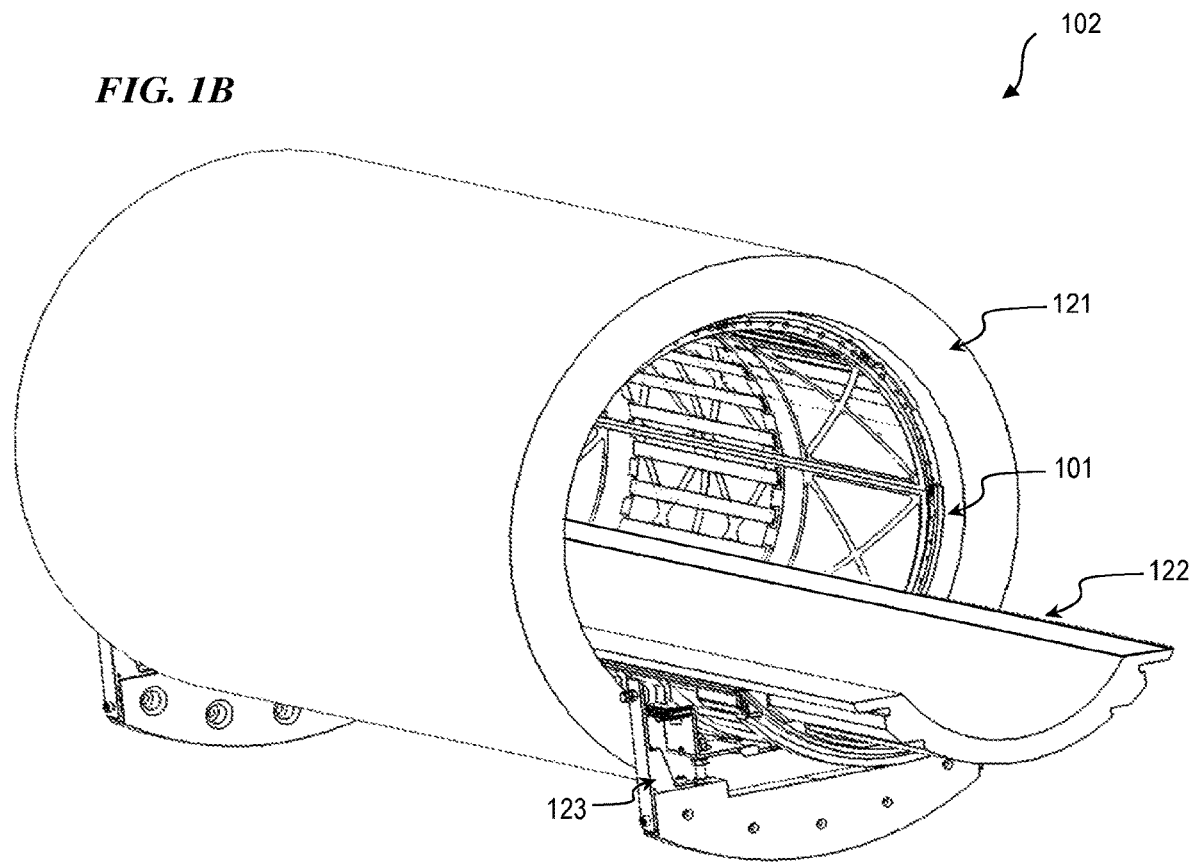
FIG. 1B is a perspective-view diagram of an MRI machine 102 that uses the same body-coil system 101 shown without inner covers, according to some embodiments of the present invention.

FIG. 1B is a perspective-view diagram of an MRI machine 102 that uses the same body-coil system 101 shown in FIG. 1A, shown here without inner covers, according to some embodiments of the present invention. In some embodiments, MRI machine 102 includes a movable patient-conveying table 122 and a support stand 123 that supports body-coil system 101. In some embodiments, support stand 123 allows removal of body-coil system 101 from MRI machine 602 for reinstallation in other machines, and/or for service. In some embodiments, individual ones of the plurality of body-coil portions 131 can be unclamped and removed without removing others of the plurality of body-coil portions 131, which allows easier repair and adjustment service than either climbing into body-coil system 101 while it is in the bore 121, or than removing the entire body-coil system 101 from the bore 121 for such service.

Figure 1C:
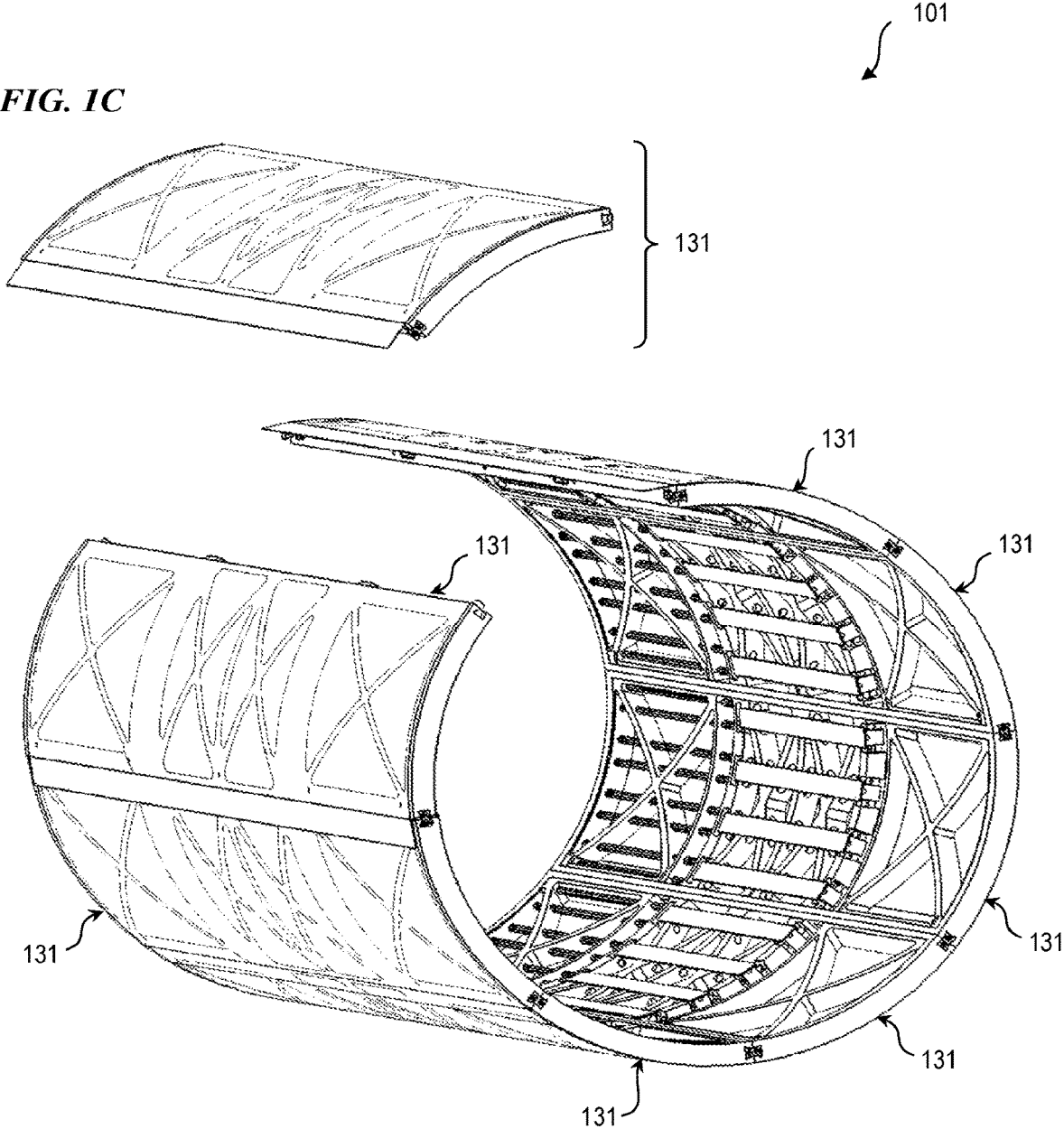
FIG. 1C is a perspective-view diagram of a body-coil system 101 in a partially assembled position and shown with some of the covers and shields, according to some embodiments of the present invention.

FIG. 1C is a perspective-view diagram of a body-coil system 101 in a partially assembled position and shown with some of the covers and shields on its eight body-coil portions 131, according to some embodiments of the present invention.

Figure 2A:
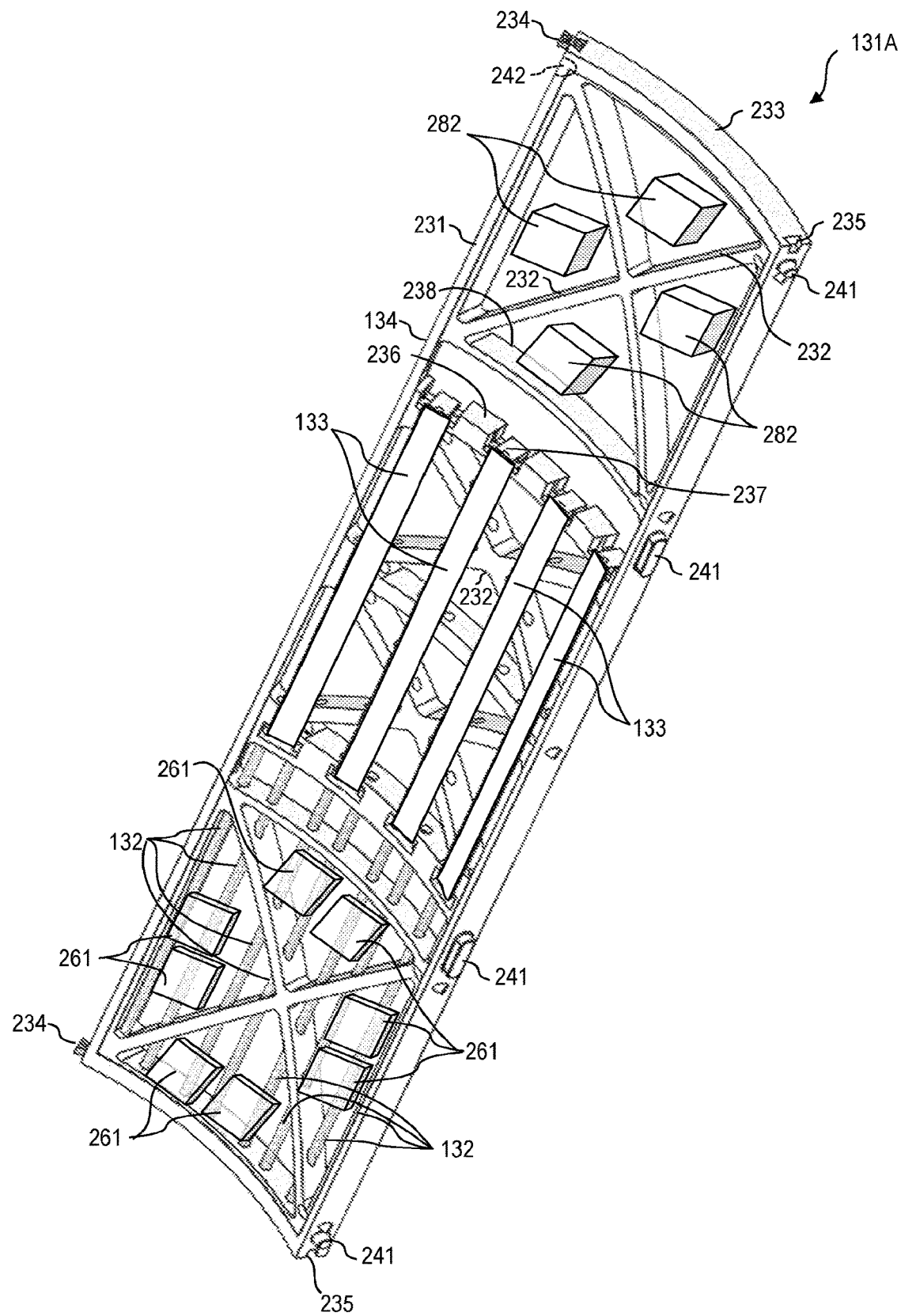
FIG. 2A is a perspective-view diagram of a body-coil portion 131 shown without covers and shields, according to some embodiments of the present invention.

FIG. 2A is a perspective-view diagram of a body-coil portion 131 shown without covers and shields, according to some embodiments of the present invention. In some embodiments, each body-coil portion 131 includes a frame 134, a plurality of antenna elements 133 mounted to frame 134, a plurality of alignment pins 241 (and a corresponding plurality of alignment-pin receptacles 242 (see FIG. 2B) for receiving alignment pins 241 of its neighboring body-coil portion 131), and interlock pieces 234 and corresponding interlock-piece receptacles 235. In some embodiments, frame 134 includes end members 233, side members 231, cross-bar members 232, and inner span members 238 to provide stiffness and low weight. Some embodiments further include mounting locations and/or enclosures 236 and 237 for holding antenna elements 133 along with tuning and matching circuitry, preamplifiers, detuning circuitry, switches and the like, thus allowing ease of maintenance and soldering. In some embodiments, frame 134 includes recesses, threaded holes or the like for receiving the inner cover 421 (see FIGS. 4A-4D and the corresponding descriptions below) and for releasably holding inner cover 421 (e.g., press-fit or screwed or glued).

Figure 2B:
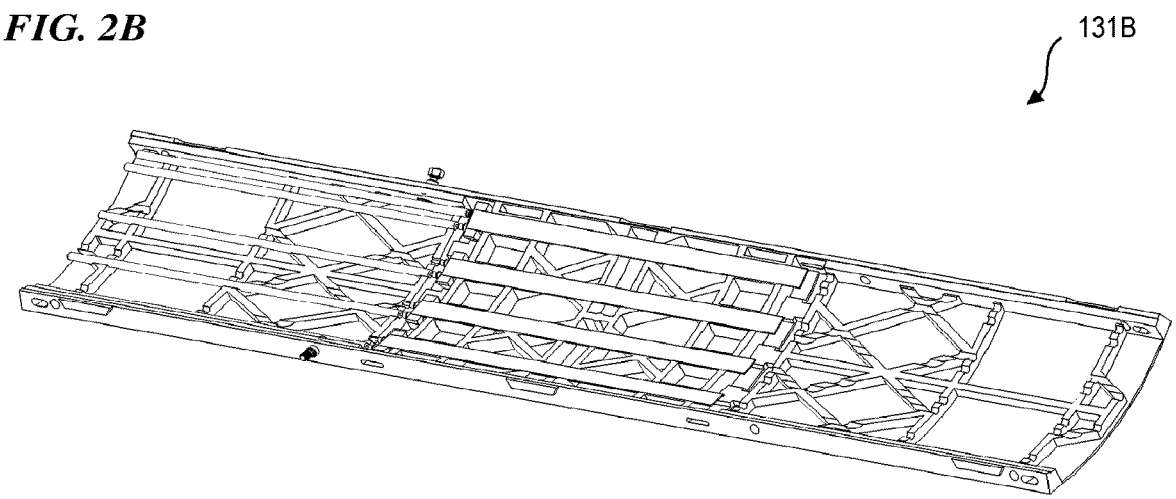
FIG. 2B is a perspective-view diagram of the inside of body-coil portion 131A shown with its outer covers and shields, according to some embodiments of the present invention.

FIG. 2B is a perspective-view diagram of the inside of body-coil portion 131A (a first embodiment of body-coil portion 131) shown with its outer covers and shields, according to some embodiments of the present invention.

Figure 2C:
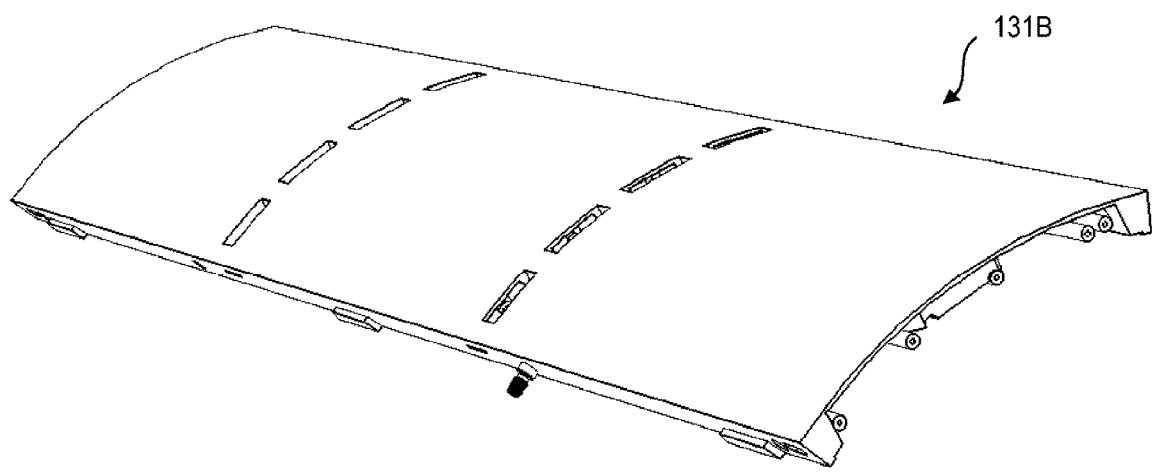
FIG. 2C is a perspective-view diagram of the outside of body-coil portion 131B shown with its outer covers and shields, according to some embodiments of the present invention.

FIG. 2C is a perspective-view diagram of the outside of body-coil portion 131B (an alternative second embodiment of body-coil portion 131) shown with its outer covers and shields, according to some embodiments of the present invention. In some preferred embodiments, body-coil portion 131B includes one or more RF power amplifiers 282 operatively coupled to drive coil elements 133 with transmit pulses. In some embodiments, body-coil portion 131B includes one or more receive pre-amplifiers 283 operatively coupled to receive RF signals from coil elements 133 not presently being used to transmit RF signals. In other embodiments, body-coil portion 131B includes one or more receive pre-amplifiers 283 operatively coupled to receive RF signals from receive elements (not shown) that are in receive-coil units (not shown, but well known in the art) that are placed in close contact with the body portion of the patient being imaged, in order to obtain stronger Rx signals. In some embodiments, the Rx preamplifiers are also located within the receive-coil units placed against the patient.

Figure 2D:
FIG. 2D is a right-side-view diagram of the outside of body-coil portion 131B shown with its outer covers and shields, according to some embodiments of the present invention.

FIG. 2D is a right-side-view diagram of the outside of body-coil portion 131B shown with its outer covers and shields, according to some embodiments of the present invention.

Figure 2E:
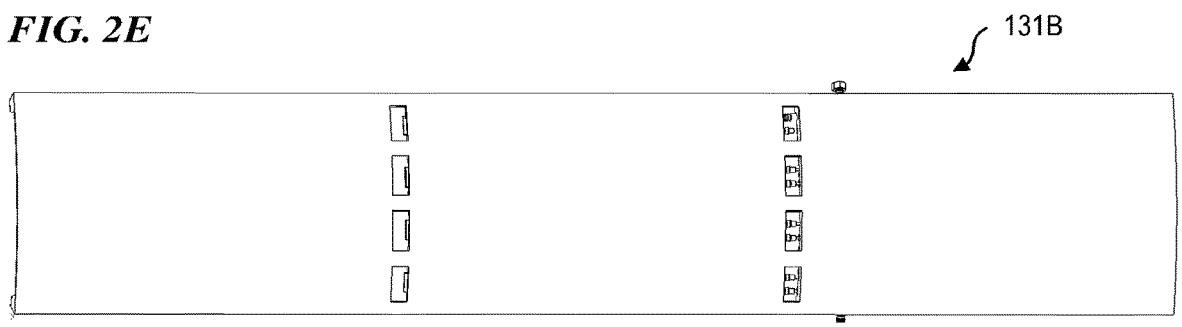
FIG. 2E is a front-view diagram of the outside of body-coil portion 131B shown with its outer covers and shields, according to some embodiments of the present invention.

FIG. 2E is a front-view diagram of the outside of body-coil portion 131B shown with its outer covers and shields, according to some embodiments of the present invention.

Figure 2F:
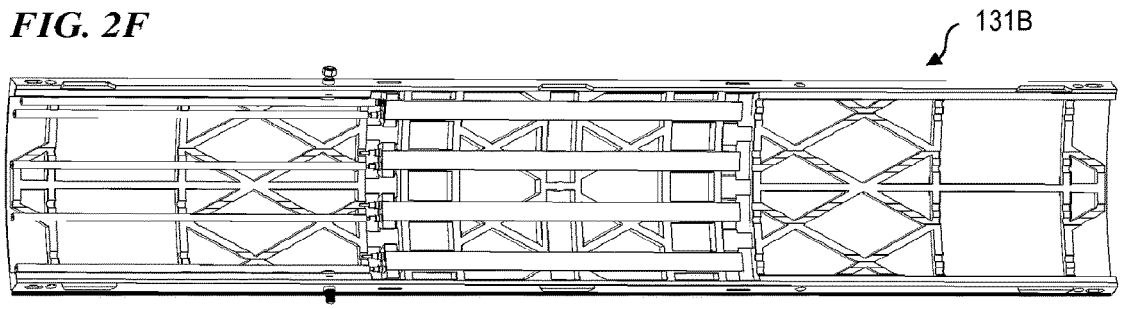
FIG. 2F is a back-view diagram of the inside of body-coil portion 131B shown with its outer covers and shields, according to some embodiments of the present invention.

FIG. 2F is a back-view diagram of the inside of body-coil portion 131B shown with its outer covers and shields, according to some embodiments of the present invention.

Figure 2G:
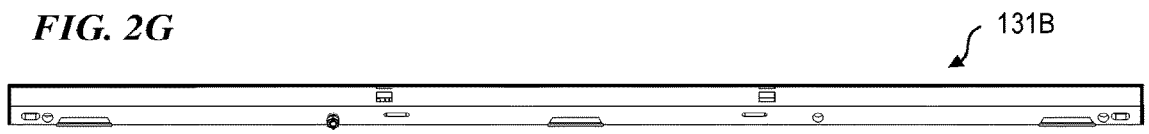
FIG. 2G is a left-side-view diagram of the outside of body-coil portion 131B shown with its outer covers and shields, according to some embodiments of the present invention.

FIG. 2G is a left-side-view diagram of the outside of body-coil portion 131B shown with its outer covers and shields, according to some embodiments of the present invention.

Figure 2H:
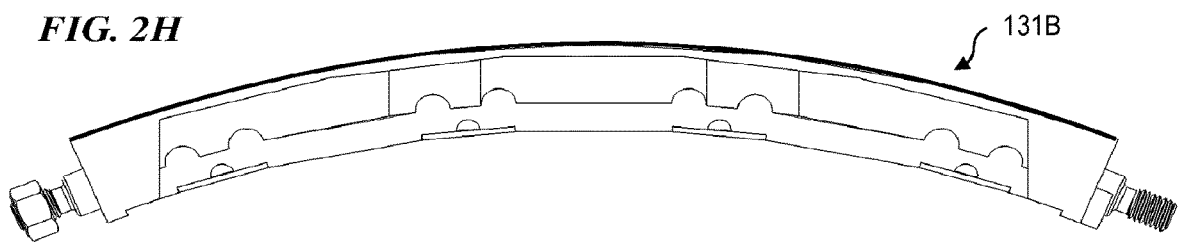
FIG. 2H is a first-end-view diagram of the outside of body-coil portion 131B shown with its outer covers and shields, according to some embodiments of the present invention.

FIG. 2H is a first-end-view diagram of the outside of body-coil portion 131B shown with its outer covers and shields, according to some embodiments of the present invention.

Figure 2I:
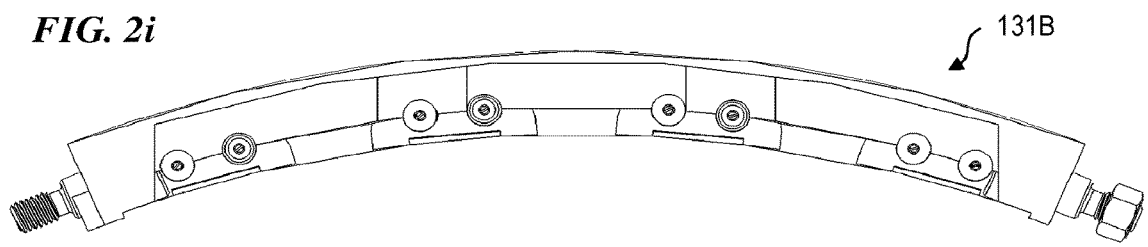
FIG. 2*i* is a second-end-view diagram of the outside of body-coil portion 131B shown with its outer covers and shields, according to some embodiments of the present invention.

FIG. 2i is a second-end-view diagram of the outside of body-coil portion 131B shown with its outer covers and shields, according to some embodiments of the present invention.

Figure 2J:
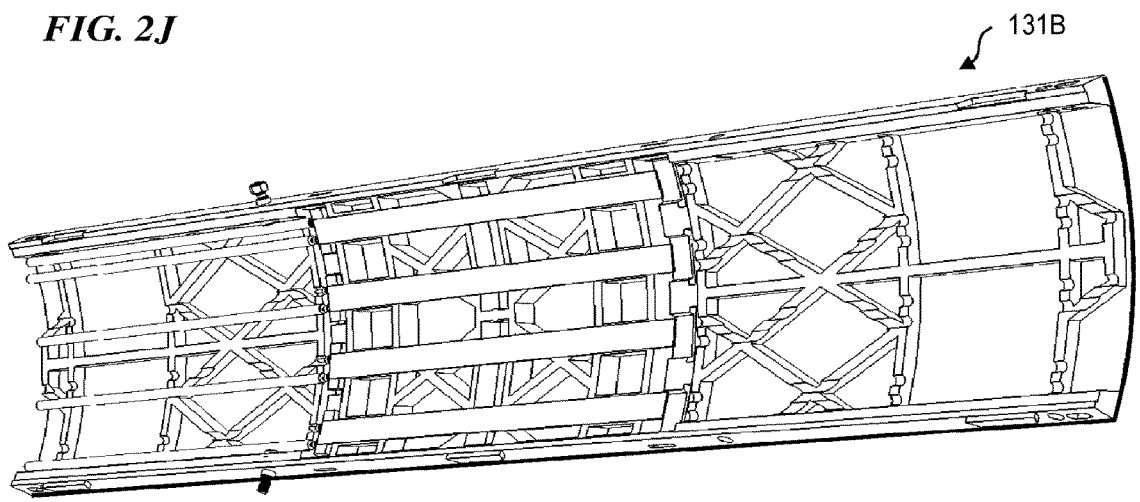
FIG. 2J is a perspective-view diagram of the inside of body-coil portion 131B shown with its outer covers and shields, according to some embodiments of the present invention.

FIG. 2J is a perspective-view diagram of the inside of body-coil portion 131B shown with its outer covers and shields, according to some embodiments of the present invention.

Figure 3A:
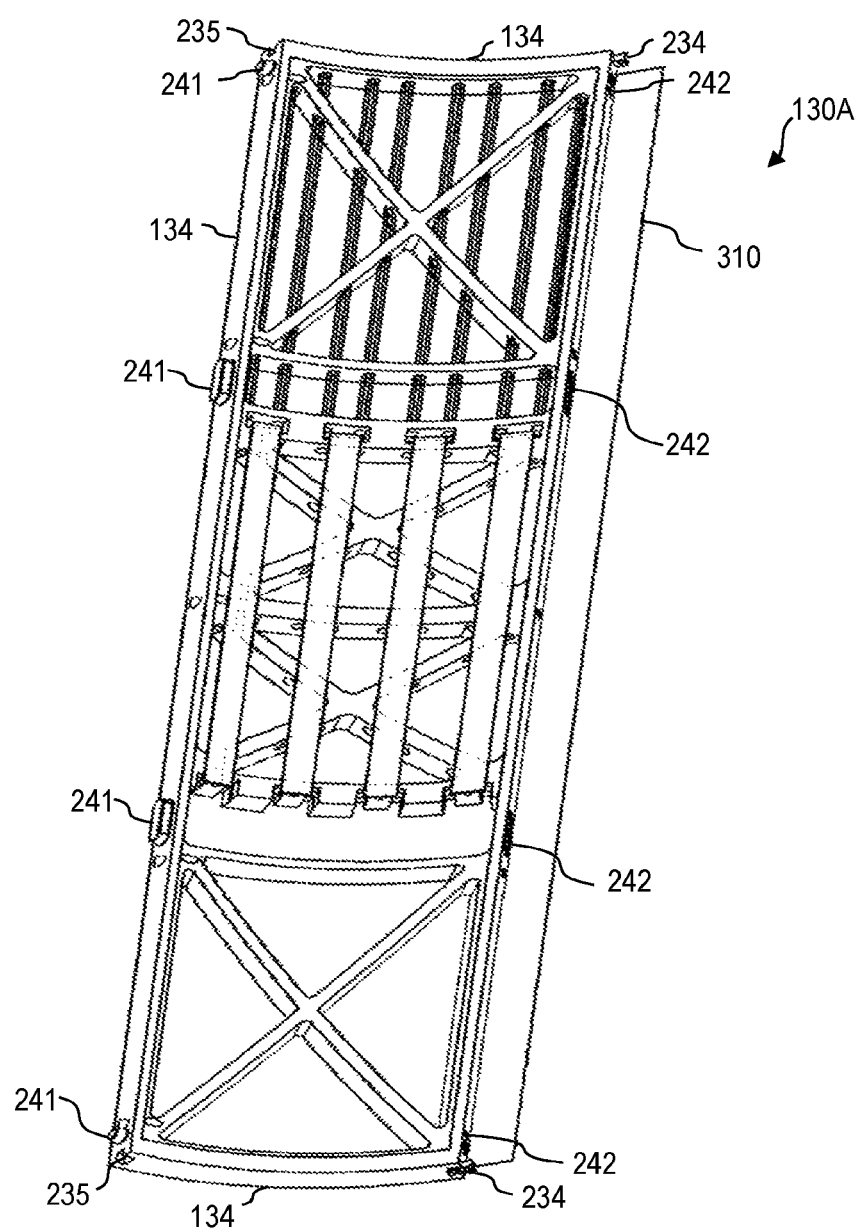
FIG. 3A is a perspective-view diagram of the inside face of a body-coil portion 131A shown without covers and shields, according to some embodiments of the present invention.

FIG. 3A is a perspective-view diagram of the inside face of a partially assembled body-coil portion 131A shown with outer covers and shields (see descriptions for FIGS. 4A-4D), according to some embodiments of the present invention.

Figure 3B:
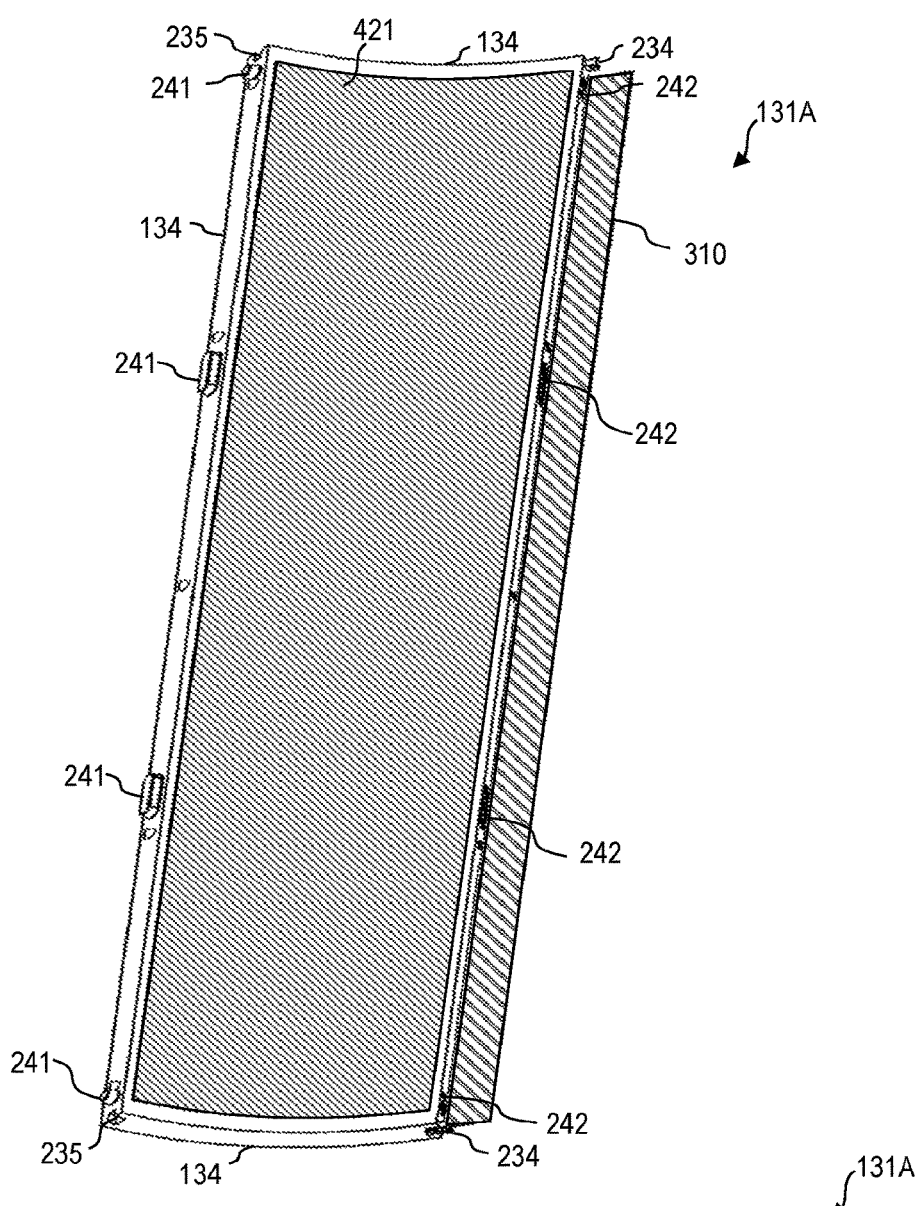
FIG. 3B is a perspective-view diagram of the inside face of a body-coil portion 131A shown with covers and shields, according to some embodiments of the present invention.

FIG. 3B is a perspective-view diagram of the inside face of body-coil portion 131A shown with covers and shields, according to some embodiments of the present invention.

Figure 3C:
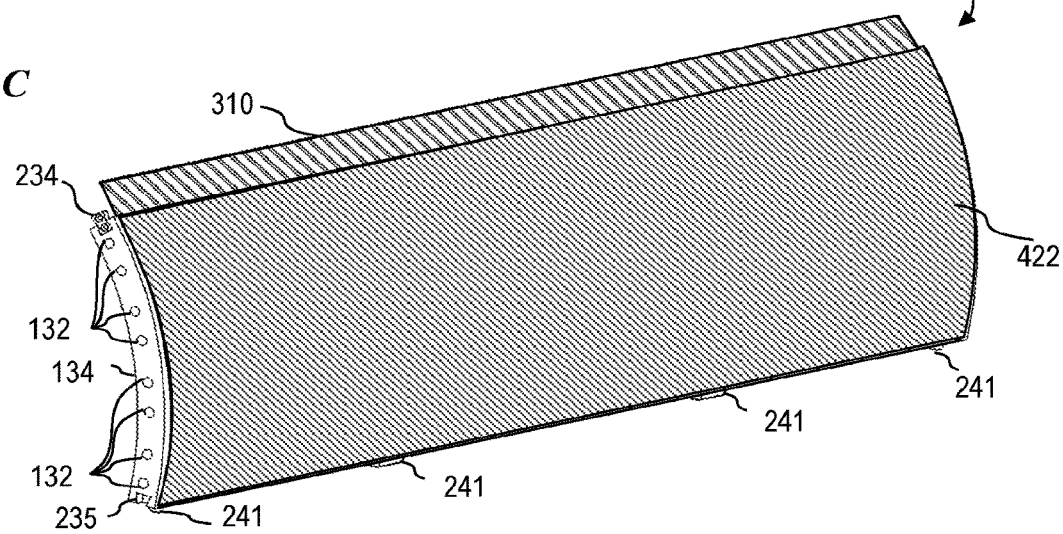
FIG. 3C is a perspective-view diagram of the outside face of a body-coil portion 131A shown with covers and shields, according to some embodiments of the present invention.

FIG. 3C is a perspective-view diagram of the outside face of a body-coil portion 131A shown with covers and shields, according to some embodiments of the present invention.

Figure 4A:
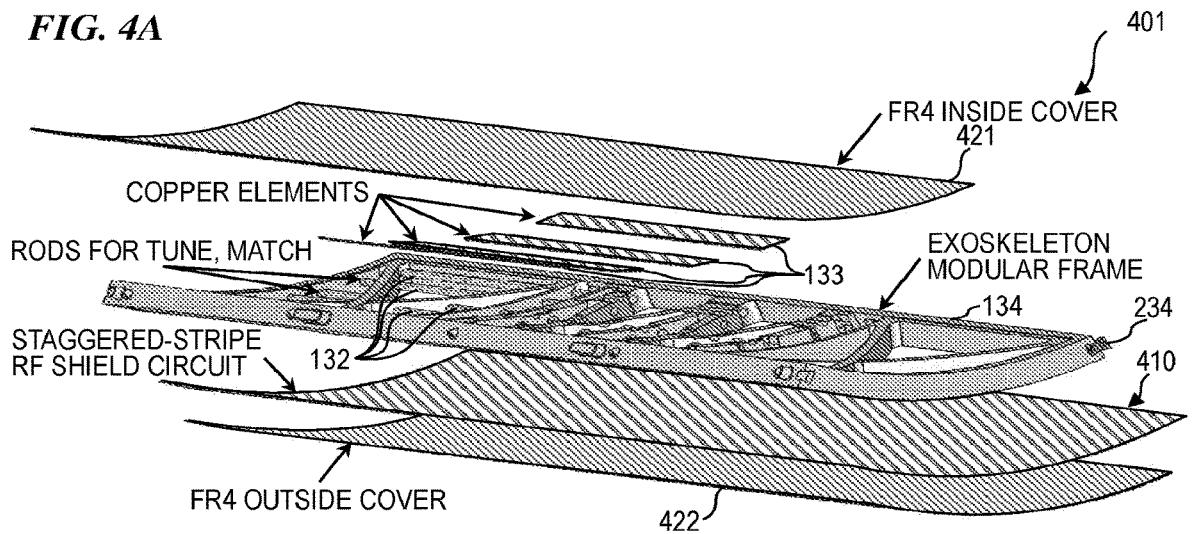
FIG. 4A is a perspective-exploded-view diagram of the inside face of parts of body-coil portion 401 shown with covers and shields, according to some embodiments of the present invention.

FIG. 4A is a perspective-exploded-view diagram of the inside face of parts of body-coil portion 401 shown with covers and shields, according to some embodiments of the present invention. The following description refers to FIGS. 4A-4D. In some embodiments, inner cover 421 includes an FR-4 (fiberglass-reinforced epoxy) sheet that fits into a corresponding recess in exoskeleton modular frame 134. In some embodiments, exoskeleton modular frame 134 is machined (using computer-numeric-controlled (CNC) mill or the like) from a single piece of fiberglass-reinforced polymer (such as epoxy). In some embodiments, a shield 410 includes a polyimide core sheet 412 (see FIG. 4C) with staggered overlapped copper stripes (stripes 411 on the concave inner face and corresponding but staggered and overlapping stripes 413 on the convex outer face) that run longitudinally parallel to the center longitudinal axis of body coil 501 and connected at one or both ends to a common electrical ground 599 (see FIG. 5A). In some embodiments, outer cover 422 also includes an FR-4 (fiberglass-reinforced epoxy) sheet that is adhesively attached to shield 410, which in turn is adhesively attached onto the outer convex face of exoskeleton modular frame 134. In some embodiments, shield 410 includes a tongue portion 425 that is inserted under an edge of the outer cover 422 of the neighboring coil portion 401, as shown in FIG. 4D.

Figure 4B:
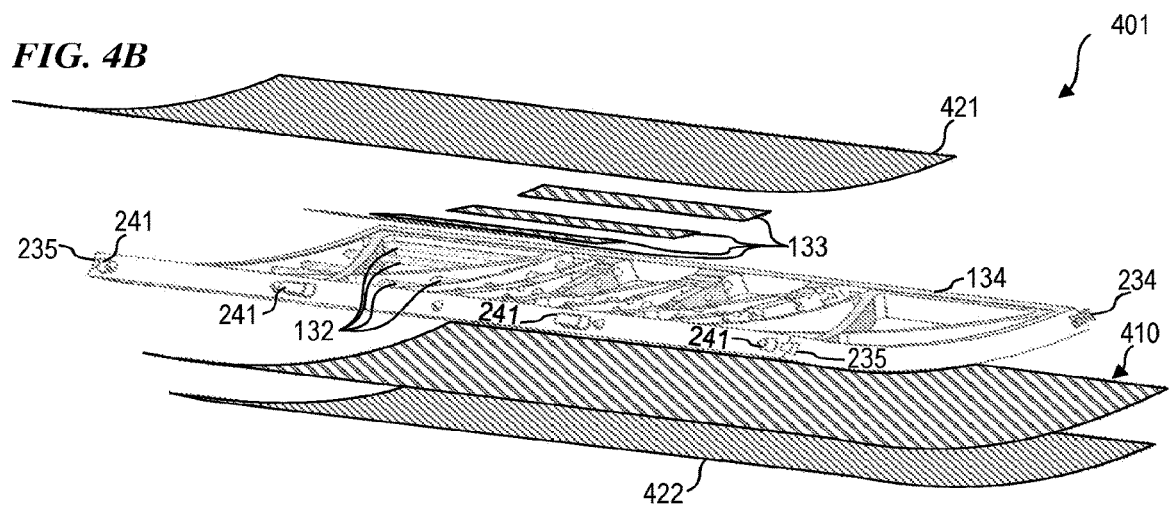
FIG. 4B is a perspective-exploded-view diagram of the inside face of parts of body-coil portion 401 (with a lighter shading) shown with covers and shields, according to some embodiments of the present invention.

FIG. 4B is a perspective-exploded-view diagram of the inside face of parts of body-coil portion 401 (with a lighter shading) shown with covers and shields, according to some embodiments of the present invention.

Figure 4C:
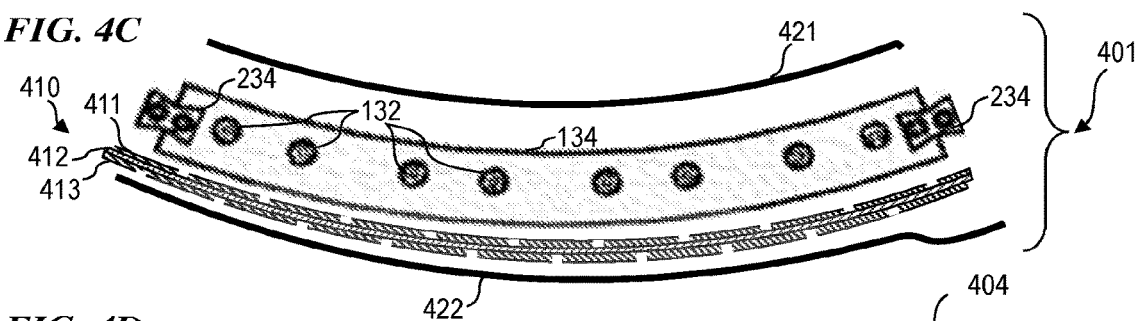
FIG. 4C is an exploded end-view diagram of the inside face of parts of body-coil portion 401 shown with covers and shields, according to some embodiments of the present invention.

FIG. 4C is an exploded end-view diagram of the inside face of parts of body-coil portion 401 shown with covers and shields, according to some embodiments of the present invention.

Figure 4D:
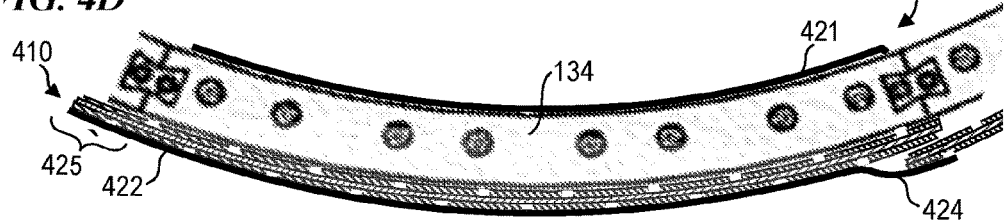
FIG. 4D is an end-view diagram of the inside face of an assembled body-coil portion 404 shown with covers and shields, according to some embodiments of the present invention.

FIG. 4D is an end-view diagram of the inside face of an assembled body-coil portion 404 shown with covers and shields, according to some embodiments of the present invention.

Figure 5A:
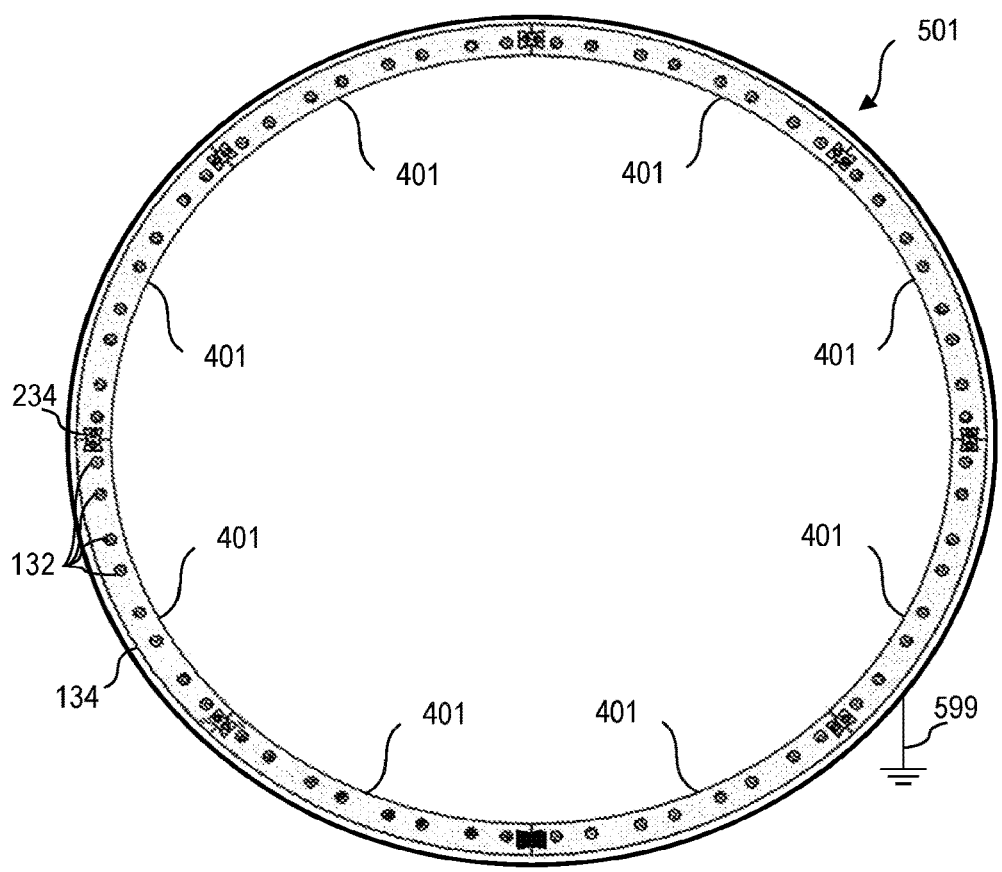
FIG. 5A is an end-view diagram of an assembled body-coil 501, according to some embodiments of the present invention.

FIG. 5A is an end-view diagram of an assembled body-coil 501, according to some embodiments of the present invention. In some embodiments, assembled body-coil 501 includes eight (8) of body-coil portions 401 (which can be any of the various embodiments of body-coil portions described herein), each of which can be disassembled from the others such that individual portions can be repaired or replaced without affecting the rest of the body-coil 501. This provides greater yield and better reliability, availability, and serviceability, since an MRI facility can order and keep one or more spare body-coil portions 401 that can be swapped out for a failed body-coil portion 401, without having to service the entire body-coil 501. Unlike conventional body-coil units that require a serviceperson to crawl into a cylinder, the individual body-coil portions 401 of the present invention can be removed and serviced on a service bench.

In addition, a conventional fiberglass body-coil unit typically is made of a single cylinder with solid walls that often weighs 100 kilograms or more and requires several persons to lift, move or adjust, while in contrast, the present invention has a plurality of body-coil portions 401 that are easily moved individually by a single worker. In some embodiments, the shield (e.g., 410) is connected at one or both ends of the cylindrical assembled body-coil 501 to a common electrical ground 599.

Figure 5B:
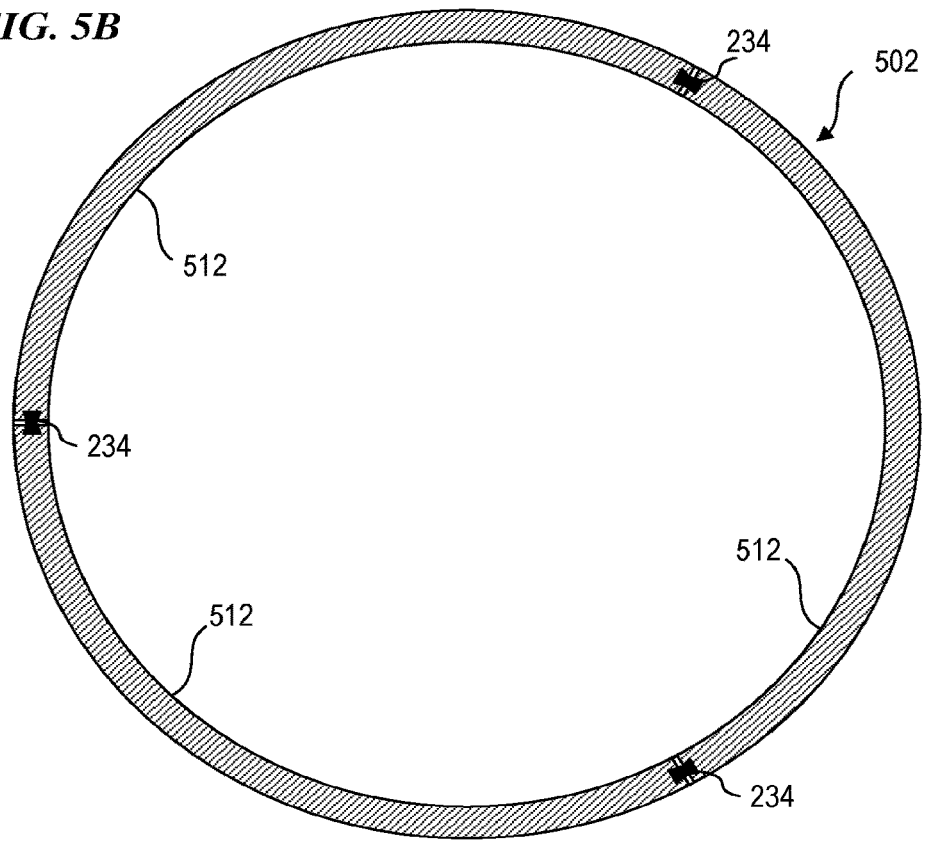
FIG. 5B is an end-view diagram of another assembled body-coil 502, according to some embodiments of the present invention.

FIG. 5B is an end-view diagram of another assembled body-coil 502, according to some embodiments of the present invention. In some embodiments, body-coil 502 has three body-coil portions 512, while in other embodiments, two body-coil portions or more than three body-coil portions are used.

Figure 5C:
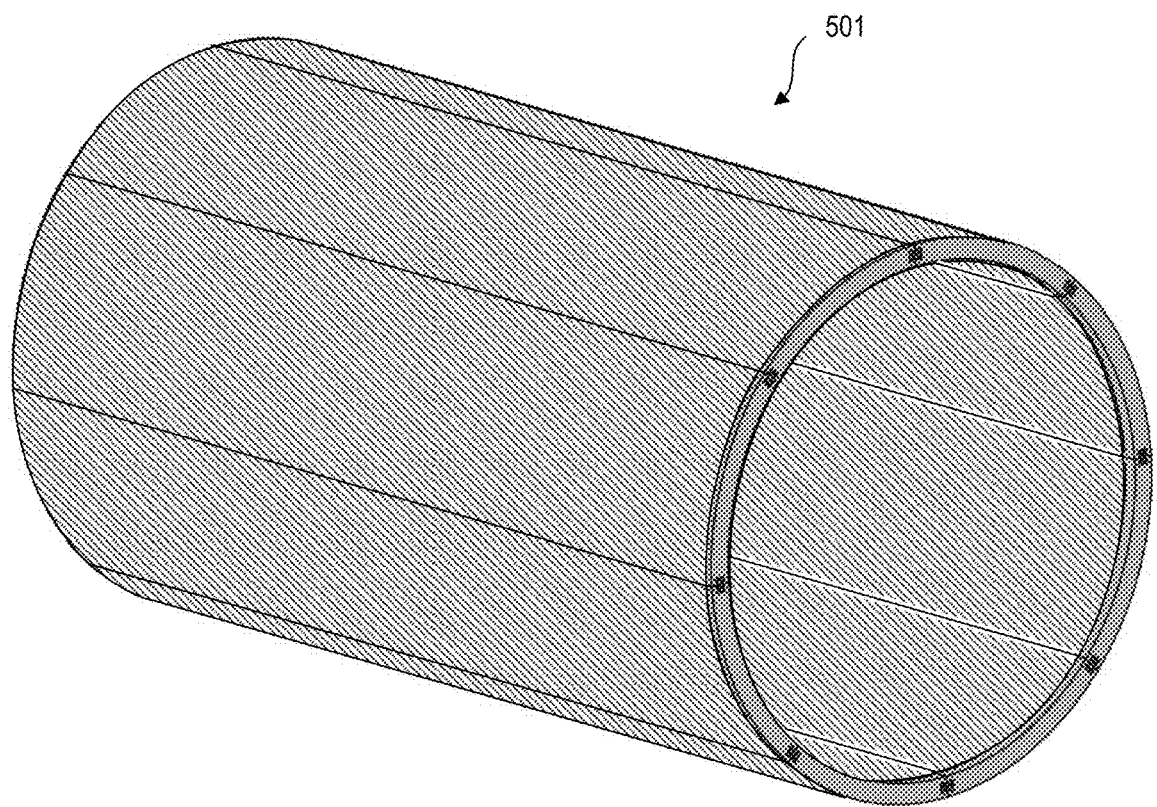
FIG. 5C is an end-view diagram of another assembled body-coil 501, according to some embodiments of the present invention.

FIG. 5C is an end-view diagram of another assembled body-coil 501 that uses eight body-coil portions, according to some embodiments of the present invention.

Figure 5D:
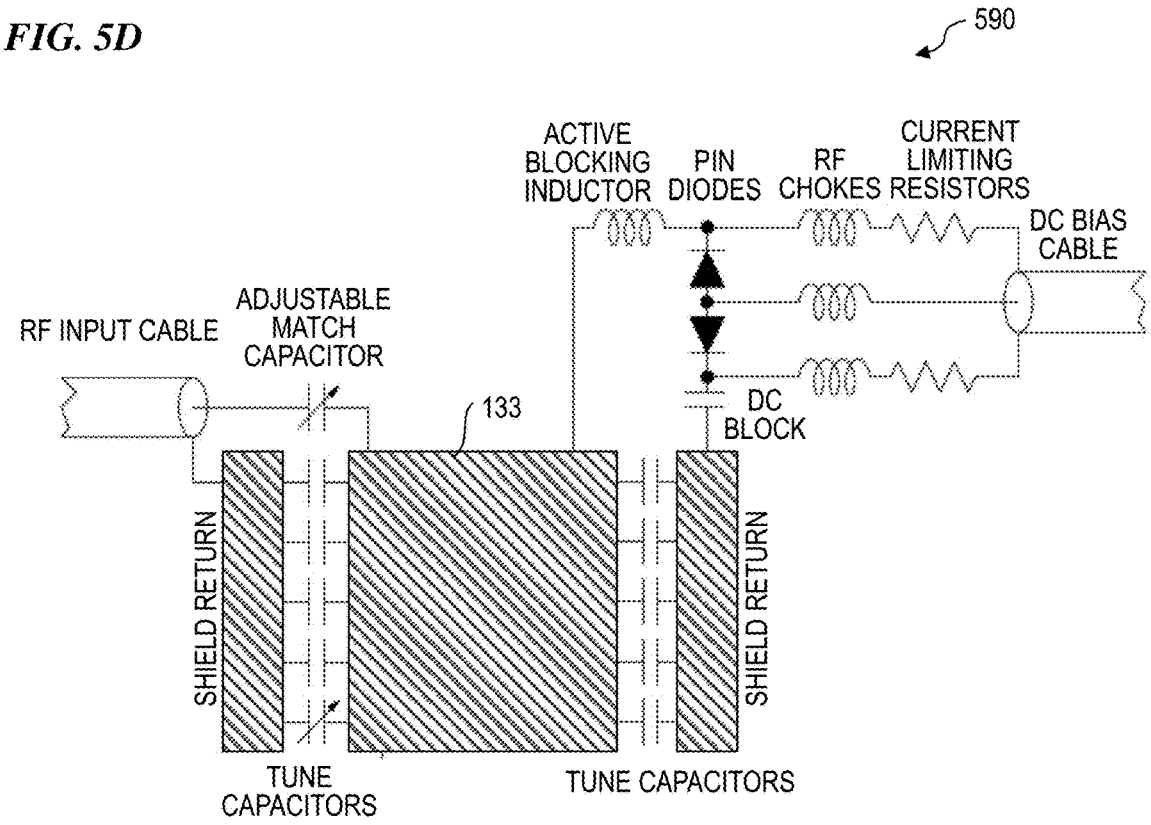
FIG. 5D is a schematic of a detune circuit 599, according to some embodiments of the present invention.

FIG. 5D is a schematic of a detune circuit 599, according to some embodiments of the present invention. In some embodiments, the RF output (transmit (Tx)) pulses are applied from the left side to coil element 133, using impedance tuning and matching capacitors that are adjusted to maximize RF output power and minimize reflection signals. In some embodiments, detuning signals are applied from the right-hand side of the diagram to detune the coil element's frequency to reduce the absorption of the Rx receive signals when the circuit is not transmitting Tx pulses.

Figure 6A:
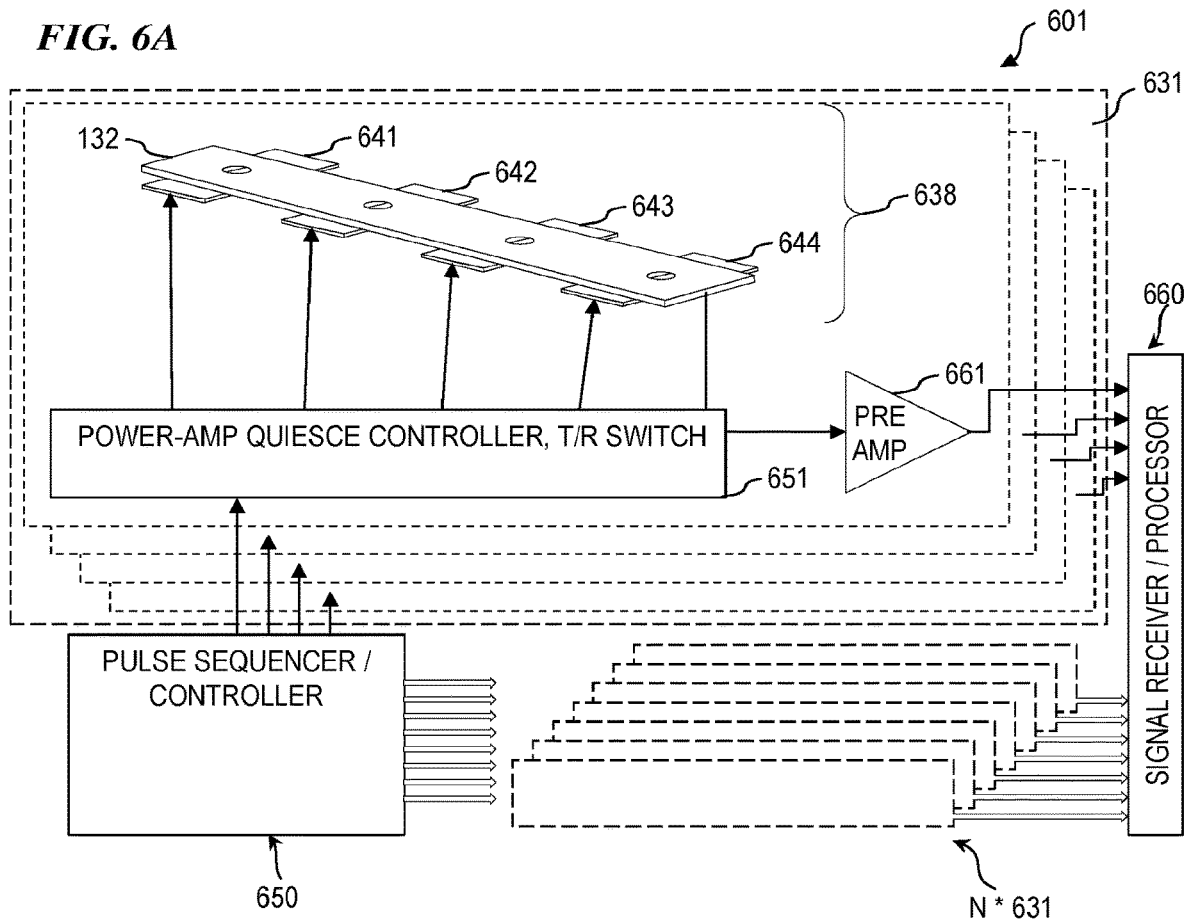
FIG. 6A is a block diagram of a body coil 601 that includes a plurality of embedded-amplifier body-coil portions 631, according to some embodiments of the present invention.

FIG. 6A is a block diagram of a body coil 601 that includes a plurality of embedded-amplifier body-coil portions 631, according to some embodiments of the present invention. In some embodiments, a plurality of embedded-amplifier body-coil portions 631 are assembled into a body coil such as body coil 100 of FIG. 1A and located in the bore 120 of an MRI machine, such as MRI machine 102 of FIG. 1B. In some embodiments, one or more power amplifiers (e.g., in some embodiments, four power amplifiers 641, 642, 643, 644 are spaced along the length of a thick (e.g., in some embodiments, about 2-mm thick and about 25-mm wide) high-purity copper bar used for each antenna element 132) are built into each of the body-coil portions 631. In some embodiments, eight body-coil portions 631 are used together (in place of body-coil portions 131 of FIG. 1A) to form a single cylindrical body coil 101. In some embodiments, each antenna element 132 has one or more power amplifiers (e.g., 641, 642, 643, 644) built into the frame of the respective body-coil portion 631.

In some embodiments, each respective body-coil portion 631 includes a power-amplifier quiesce controller to control the powering of the power amplifiers and the application of RF output transmit pulses (TX pulses), and Tx/Rx (transmit/receive, also called T/R) switches that disconnect the low-signal-power RF receive preamplifiers 645 during times when high-power TX pulses are being transmitted. In some embodiments, a pulse sequencer/controller 650 (implemented either as a single unit for the entire body coil 101, or as distributed-function units located in the individual body-coil portions 631) is used to apply the RF in a manner so as to generate circularly polarized TEM signal, such as is well-known and described in the patents and patent applications incorporated by reference in the background section of this specification.

In some embodiments, a signal receiver/processor obtains the received RF signals that were preamplified by the plurality of preamplifiers 645, and combines the received signals from the various antenna elements 132 and delivers a plurality of processed received signals to the MRI imaging circuitry and processors, as is well known in the art and described in the patents and patent applications incorporated by reference in the background section of this specification. In some embodiments, simultaneous transmit-receive functionality (such In some embodiments, a plurality of power amplifiers to synergistically drive a single antenna element sequentially, such that while one power amplifier is driving the antenna element, the other ones of the power amplifiers for that element are quiesced and allowed to cool. In some embodiments, the plurality of power amplifiers (e.g., 641, 642, 643, 644) for each antenna element 132 are each spaced along the length and affixed to the respective antenna elements 132 and use them as heat sinks to dissipate heat from operation of the power amplifiers (e.g., 641, 642, 643, 644). For example, in some embodiments, a first RF power pulse to be applied to the $N^{th}$ respective antenna element 132 (one of thirty-two such antenna elements of body coil 101) would be driven by power amplifier 641 of that respective antenna element 132, then later when a second RF power pulse is to be applied to the same $N^{th}$ respective antenna element 132, power amplifier 643 would be used, then later when a third RF power pulse is to be applied to the same $N^{th}$ respective antenna element 132, power amplifier 642 would be used, then later when a fourth RF power pulse is to be applied to the same $N^{th}$ respective antenna element 132, power amplifier 644 would be used, and for later pulses, the sequence is repeated. Similar quiescing sequences are used for the power amplifiers on each of the other respective coil elements 638 (where 638 refers to the copper antenna element 132 along with its plurality of power amplifiers 641-644). This spreads the power-amplifier heat to be dissipated along the entire length of the copper antenna element 132.

Figure 6B:
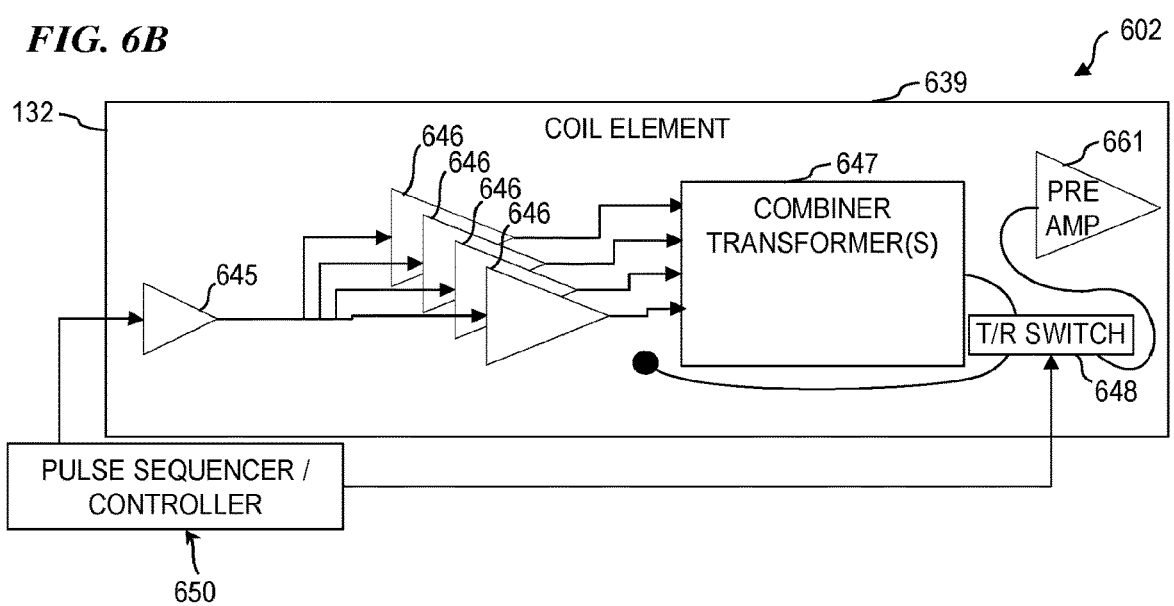
FIG. 6B is a block diagram of a portion of a body coil 602 that includes a plurality of embedded-amplifier body-coil portions 639 (one of which is shown here), according to some embodiments of the present invention.

FIG. 6B is a block diagram of a portion of an alternative embodiment, body coil 602, that includes a plurality of embedded-amplifier body-coil portions 639 (one of which is shown), according to some embodiments of the present invention. In some embodiments, body coil 602 uses a plurality of power amplifiers 646 (in some embodiments, driven by one or more power pre-amplifiers 645), all affixed on each respective coil element 639 to synergistically drive that single antenna element 639 simultaneously (as opposed to the sequential pulses from one power amplifier while the other power amplifiers for that coil element are quiesced, as described in the previous paragraph), each power amplifier 646 can operate at lower currents and/or voltages and lower powers, and their combined RF power is combined by combiner transformers 647 that increase the voltage and match the impedance of the copper antenna element 132 (to which they are affixed in order to dissipate the waste heat generated by the power amplifiers).

In some embodiments, the copper antenna elements 132 are thick and wide high-purity copper bars (e.g., in some embodiments, about 1.5 mm thick by about 25 mm wide by about 450 mm long). In some embodiments, each of the copper antenna elements 132 have a rectangular cross section in the three orthogonal planes. In other embodiments, the copper antenna elements 132 are thick-walled hollow high-purity copper tubes (e.g., in some embodiments, about 0.5 mm thick by about 7 mm in diameter by about 450 mm long). In some embodiments, thirty-two copper antenna elements 132 are used. In some other embodiments, sixteen or sixty-four copper antenna elements 132 are used. In still other embodiments, other shapes and/or sizes and/or numbers and/or types of metal for the antenna elements are used.

In some embodiments, the coil elements and/or functional modules (power TX amplifiers, RX preamplifiers, Tx/Rx switches, controllers and the like) in the body-coil units (e.g., 101, 601 or 602) support a plurality of different frequencies multiple nuclei/frequencies. In some embodiments, the present invention provides multiples varieties of each module for various nuclei (different frequencies), as well as supporting dual and/or triple frequencies, each being independently electrically tuned within each module, and iteratively tuned and impedance-matched relative to one another. In some embodiments, each of a plurality of such modules are swapped in and out and the device 101 and then works over multiple field strengths, nuclei, frequencies, modes, and the like.

Also, in some embodiments, the body-coil units (e.g., 101, 601 or 602) are configured to be removed from the MRI machine (e.g., removed from magnet bore 121 of MRI machine 102) and put onto various bases 123, each having different mechanical shapes and/or mating configurations (e.g., displacement-adjustment only versus angle-adjustment only versus both angle-adjustment and displacement-adjustment) to allow combined use with other radiological systems, devices, suites (e.g., different vendor's MR systems or table tops, other radiological system tools (e.g., computed tomography (CT), X-Ray, positron-emission tomography (PET), and the like), as well as cooperative interoperability with surgical tables, patient training/prep rooms, etc.).

In some embodiments, the present invention provides an apparatus for receiving radio-frequency (RF) signals suitable for magnetic-resonance imaging (MRI) and/or magnetic-resonance spectroscopy (MRS) from radio-frequency (RF) coils that are overlapped and/or concentric, but optionally sized differently and/or located at different elevations (distances from the patient's tissue) in order to extract signal from otherwise cross-coupled coil loops and to improve signal-to-noise ratio (SNR) of the received signal. This apparatus includes a plurality of independently positionable substrates, each having a first major surface and a second major surface; a plurality of receiver-electronics units mounted on each substrate, wherein the plurality of receiver-electronics units on each substrate includes a first receiver-electronics unit and a second receiver-electronics unit, and wherein each one of the plurality of receiver-electronics units on each substrate generates a respective output signal; a plurality of RF receiver units affixed to each substrate, wherein the plurality of RF receiver units includes a first RF receiver unit having a first antenna loop that is connected to the first receiver-electronics unit and a second RF receiver unit having a second antenna loop that is connected to the respective receiver-electronics unit; and decoder electronics operatively coupled to receive the output signals from the plurality of RF receiver units and configured to remove common-mode signals from the output signals from the plurality of RF receiver units.

In some embodiments, each of the plurality of body-coil portions further includes a set of adjustment circuits that each includes: a frequency-tuning capacitor, an impedance-matching capacitor, an RF trap, and a preamplifier.

In some embodiments, each of the plurality of body-coil portions further includes: a least one frequency-tuning capacitor, a plurality of impedance-matching capacitors, a plurality of RF traps, and a plurality of preamplifiers.

In some embodiments, the present invention provides an apparatus for receiving radio-frequency (RF) signals suitable for magnetic-resonance imaging (MRI) and/or magnetic-resonance spectroscopy (MRS) from radio-frequency (RF) coils that are overlapped and/or concentric, but optionally sized differently and/or located at different elevations (distances from the patient's tissue) in order to extract signal from otherwise cross-coupled coil loops and to improve signal-to-noise ratio (SNR) of the received signal. In some such embodiments, the apparatus includes a substrate having a first major surface and a second major surface; a first plurality of receiver-electronics units mounted on the substrate, wherein the first plurality of receiver-electronics units includes a first receiver-electronics unit and a second receiver-electronics unit, and wherein each one of the first plurality of receiver-electronics units generates an output signal; a plurality of RF receiver units affixed to the substrate, wherein the plurality of RF receiver units includes a first RF receiver unit having a first antenna loop that is connected to the first receiver-electronics unit and a second RF receiver unit having a second antenna loop that is connected to the first receiver-electronics unit; and decoder electronics operatively coupled to receive the output signals from the plurality of RF receiver units and configured to remove common-mode signals from the output signals from the plurality of RF receiver units.

In some embodiments, the first antenna element is affixed to the first major surface of the substrate and the second antenna element is affixed to the second major surface such that the first antenna element overlaps the second antenna element such that a line perpendicular to the first major surface and passing through a center point of the first antenna element is laterally offset from a center point of the second antenna element. In some such embodiments, the apparatus further includes a second plurality of receiver-electronics units mounted on the substrate, wherein the second plurality of receiver-electronics units includes a third receiver-electronics unit operatively coupled to receive signals from the first antenna element and a fourth receiver-electronics unit operatively coupled to receive signals from the second antenna element, and wherein each one of the first plurality of receiver-electronics units generates its respective output signal and each one of the second plurality of receiver-electronics units generates its respective output signal, and the respective output signals are combined and decoded by the decoder electronics.

In some embodiments, the first antenna element is affixed to the first major surface of the substrate and the second antenna element is affixed to the second major surface and centered over the first antenna element such that a center point of the first antenna element and a center point of the second antenna element are both located on a single line perpendicular to the first major surface.

In some embodiments, the first antenna element is affixed to the first major surface of the substrate and the second antenna element is affixed to the second major surface and laterally offset from the first antenna element such that a center point of the first antenna element and a center point of the second antenna element are each located on one of two spaced-apart lines perpendicular to the first major surface.

In some embodiments, the first antenna loop is affixed to the first major surface of the substrate and the second antenna loop is affixed to the first major surface and centered relative to the first antenna loop such that a center point of the first antenna loop and a center point of the second antenna loop are located within two millimeters from one another, and wherein the first antenna loop and the first antenna loop are substantially equidistant from a center axis.

Some embodiments of the method further include automatically adjusting electrical parameters of the receiver-electronics units to adjust their resonance frequency.

Some embodiments of the method further include automatically adjusting electrical parameters of the receiver-electronics units to adjust the resonance frequency by moving a non-magnetic mechanical-movement device.

In some embodiments of the method, the receiver-electronics units each includes a plurality of pi networks arranged at different radial directions around a shielded RF cable.

In some embodiments, the method further includes automatically adjusting electrical parameters of the receiver-electronics units to adjust their resonance frequency.

In some embodiments, the present invention provides a non-transitory computer-readable medium having instructions stored thereon for causing a suitably programmed information processor to execute a method that includes receiving RF MRI signals with a plurality of antenna elements each mounted to a different one of a plurality of coil portions; pre-amplifying the received RF MRI signals using a plurality of receiver-electronics units to generate output signals; and removing common-mode signals from the output signals. In some embodiments, the medium contains instructions such that the method further includes using a feedback signal operatively coupled to the programmable information-processing device to provide feedback control in order to maintain an electrical parameter of the plurality of receiver-electronics units. In some embodiments, the medium contains instructions such that the method further includes controlling resistance, inductance and capacitance (RLC) values of the plurality of receiver-electronics units.

In some embodiments, the present invention provides a non-transitory computer-readable medium having instructions stored thereon for causing a suitably programmed information processor to execute a method that includes: auto-controlling an electrical parameter of each of a plurality of receiver-electronics units that is mounted to a MRI body-coil unit. In some embodiments, the medium contains instructions such that the method further includes using a feedback signal operatively coupled to the programmable information-processing device to provide feedback control in order to maintain the electrical parameter of the plurality of receiver-electronics units. In some embodiments, the medium contains instructions such that the method further includes controlling resistance, inductance and capacitance (RLC) values of the plurality of receiver-electronics units.

In some embodiments, the present invention provides a non-transitory computer-readable medium having instructions stored thereon for causing a suitably programmed information processor to execute a method that comprises: auto-controlling an electrical parameter of an LC circuit that is mounted to a case of a snap-on balun attached to a shielded RF cable that has a peripheral shield conductor and at least one inner conductor for carrying RF signals, wherein the LC circuit has a resonance frequency at a frequency of RF signals carried on the at least one inner conductor, wherein the case includes a piercing structure electrically connected to the LC circuit and configured to pierce and electrically connect the LC circuit to the shield conductor of the shielded RF cable.

In some embodiments of the computer-readable medium, the method further includes using a feedback signal operatively coupled to the programmable information-processing device to provide feedback control in order to maintain the electrical parameter of the LC circuit.

In some embodiments of the computer-readable medium, the method further includes controlling resistance, inductance and capacitance (RLC) values of the LC circuit.

In some embodiments, the present invention provides an apparatus for transmitting and/or receiving radio-frequency (RF) signals suitable for magnetic-resonance imaging (MRI)

and/or magnetic-resonance spectroscopy (MRS) from a radio-frequency (RF) coil that is easily assembled, disassembled and reassembled. This apparatus includes: a plurality of body-coil portions, each one of the plurality of body-coil portions having: a frame having a concave inner face and a convex outer face; at least one RF coil element mounted to the frame; a tune-and-match circuit operatively coupled to each of the at least one RF coil element; a shield that includes a plurality of partially overlapped staggered conductors on opposite faces of a dielectric substrate, wherein the shield is coupled to the convex outer face of the frame; and an alignment mechanism to align each body-coil portion to each of a plurality of neighboring body-coil portions; and an interconnection circuit configured to electrically operate (transmit to and/or receive from) the RF coil elements in a plurality of the plurality of body-coil portions. In some embodiments, the present invention provides a single body coil portion configured to be used alone or with other like units.

Some embodiments further include a plurality of clamping mechanisms operable to lock the plurality of body-coil portions to one another. In some embodiments, adhesive tape applied over the lengths of the inside and/or outside joints between body-coil portions, is used to lock the plurality of body-coil portions to one another.

Some embodiments further include a plurality of electrically controllable positioning mechanisms operable to change electrical parameters of the tune-and-match circuit.

Some embodiments further include a plurality of electrically controllable circuits operable to change electrical parameters of the tune-and-match circuit.

In some embodiments, the shield of each one of the body-coil portions partially overlaps the shield of at least one neighboring body-coil portion.

In some embodiments, the present invention provides an apparatus for transmitting and/or receiving radio-frequency (RF) signals suitable for magnetic-resonance imaging (MRI) and/or magnetic-resonance spectroscopy (MRS) from a radio-frequency (RF) coil that is easily assembled, disassembled and reassembled, the apparatus including: a plurality of body-coil portions, each one of the plurality of body-coil portions having: a frame having a concave inner face and a convex outer face, at least one RF coil element mounted to the frame, a tune-and-match circuit operatively coupled to each of the at least one RF coil element, a shield, wherein the shield is coupled to the convex outer face of the frame, and an alignment mechanism to align each body-coil portion to each of a plurality of neighboring body-coil portions; and an interconnection circuit configured to electrically operate and transmit RF signals to and/or receive RF signals from the RF coil elements in a plurality of the plurality of body-coil portions.

Some embodiments of the apparatus further include a plurality of clamping mechanisms operable to lock the plurality of body-coil portions to one another.

Some embodiments of the apparatus further include a plurality of electrically controllable positioning mechanisms operable to change electrical parameters of the tune-and-match circuit of each one of the plurality of body-coil portions.

Some embodiments of the apparatus further include a plurality of electrically controllable circuits operable to change electrical parameters of the tune-and-match circuit of each one of the plurality of body-coil portions.

In some embodiments of the apparatus, the shield of each one of the plurality of body-coil portions partially overlaps the shield of at least one neighboring body-coil portion.

In some embodiments of the apparatus, the shield includes a plurality of partially overlapped staggered conductors on opposite faces of a dielectric substrate structure.

Some embodiments of the apparatus further include at least one RF power amplifier affixed to each of a plurality of the RF coil elements, wherein the at least one RF power amplifier uses the RF coil element to which it is affixed as a heat-dissipation device, and at least one RF preamplifier connected to each of a plurality of the RF coil elements.

In some embodiments, the present invention provides a method for making a radio-frequency (RF) coil that is easily assembled, disassembled and reassembled, the method including: forming a plurality of body-coil portions, each one of the plurality of body-coil portions having a frame having a concave inner face and a convex outer face; mounting at least one RF coil element mounted to the frame of each one of the plurality of body-coil portions; operatively coupling a tune-and-match circuit to each of the at least one RF coil element, RF shielding the convex outer face of the frame of each one of the plurality of body-coil portions; attaching each one of the plurality of body-coil portions to at least one neighboring body-coil portion; and transmitting RF signals to and receiving RF signals from the RF coil elements in a plurality of the plurality of body-coil portions.

In some embodiments of the method, the attaching further includes aligning and clamping the plurality of body-coil portions to one another.

Some embodiments of the method further include electrically controlling mechanical units that change electrical parameters of the tune-and-match circuit of each one of the plurality of body-coil portions.

Some embodiments of the method further include electrically controlling a plurality of electrically controllable circuits operable to change electrical parameters of the tune-and-match circuit of each one of the plurality of body-coil portions.

In some embodiments of the method, the shielding includes partially overlapping the shield of each one of the plurality of body-coil portions with the shield of at least one neighboring body-coil portion.

In some embodiments of the method, the shielding includes using a plurality of partially overlapped staggered conductors on opposite faces of a dielectric substrate structure.

Some embodiments of the method further include affixing at least one RF power amplifier to each of a plurality of the RF coil elements; using the RF coil element as a heat-dissipation device for the at least one RF power amplifier to which it is affixed, and connecting at least one RF preamplifier to each of a plurality of the RF coil elements.

In some embodiments, the present invention provides an apparatus for transmitting and/or receiving radio-frequency (RF) signals suitable for magnetic-resonance imaging (MRI) and/or magnetic-resonance spectroscopy (MRS) from a radio-frequency (RF) coil that is easily assembled, disassembled and reassembled, the apparatus including: means for forming a plurality of body-coil portions, each one of the plurality of body-coil portions having a frame having a concave inner face and a convex outer face; means for mounting at least one RF coil element mounted to the frame of each one of the plurality of body-coil portions; means for operatively coupling a tune-and-match circuit to each of the at least one RF coil element; means for RF shielding the convex outer face of the frame of each one of the plurality of body-coil portions; means for attaching each one of the plurality of body-coil portions to at least one neighboring body-coil portion; and means for transmitting RF signals to and receiving RF signals from the RF coil elements in a plurality of the plurality of body-coil portions.

In some embodiments, the means for attaching further includes means for aligning and clamping the plurality of body-coil portions to one another.

Some embodiments further include means for electrically controlling mechanical units that change electrical parameters of the tune-and-match circuit of each one of the plurality of body-coil portions.

Some embodiments further include means for electrically controlling a plurality of electrically controllable circuits operable to change electrical parameters of the tune-and-match circuit of each one of the plurality of body-coil portions.

In some embodiments, the means for shielding includes partially overlapped the shield of each one of the plurality of body-coil portions with the shield of at least one neighboring body-coil portion.

In some embodiments, the means for shielding includes a plurality of partially overlapped staggered conductors on opposite faces of a dielectric substrate structure.

Some embodiments further include means for affixing at least one RF power amplifier to each of a plurality of the RF coil elements; means for using the RF coil element as a heat-dissipation device for the at least one RF power amplifier to which it is affixed, and means for connecting at least one RF preamplifier to each of a plurality of the RF coil elements.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A radio-frequency (RF) coil apparatus for transmitting and/or receiving RF signals suitable for magnetic-resonance imaging (MRI), the apparatus comprising:
   a plurality of body-coil portions, each one of the plurality of body-coil portions having:
      a frame having a concave inner face and a convex outer face,
      at least one RF coil element mounted to the frame,
      at least one output RF power amplifier affixed to each of the at least one RF coil element to provide an RF transmit signal to the at least one RF coil element,
      an RF shield, wherein the RF shield is coupled to the convex outer face of the frame, and
      at least one alignment mechanism to align the body-coil portion to a neighboring body-coil portion; and
   an interconnection circuit configured to supply RF transmit signals to the RF power amplifiers of a plurality of the plurality of body-coil portions.

2. The apparatus of claim 1, further comprising:
   at least one input RF preamplifier operatively connected to each of the at least one RF coil element to preamplify RF signals received by the at least one RF coil element.

3. The apparatus of claim 1, further comprising:
   a tune-and-match circuit on each respective one of the plurality of body-coil portions that is operatively coupled to the at least one RF coil element of the respective one of the plurality of body-coil portions; and
   a plurality of electrically controllable positioning mechanisms operable to change electrical parameters of the tune-and-match circuit of each one of the plurality of body-coil portions.

4. The apparatus of claim 1, further comprising:
   a tune-and-match circuit on each respective one of the plurality of body-coil portions that is operatively coupled to the at least one RF coil element of the respective one of the plurality of body-coil portions; and
   a plurality of electrically controllable circuits operable to change electrical parameters of the tune-and-match circuit of each one of the plurality of body-coil portions.

5. The apparatus of claim 1, wherein the shield of each one of the plurality of body-coil portions partially overlaps the shield of at least one neighboring body-coil portion.

6. The apparatus of claim 1, wherein the shield includes a plurality of partially overlapped staggered conductors on opposite faces of a dielectric substrate structure.

7. The apparatus of claim 1, wherein the at least one RF power amplifier uses the RF coil element to which it is affixed as a heat-dissipation device.

8. The RF coil apparatus of claim 1, further comprising:
   an MRI magnet having a magnet bore, wherein the plurality of body-coil portions is coupled to the MRI magnet; and
   a patient-transport mechanism coupled to the RF coil apparatus and configured to move a patient into and out of the magnet bore.

9. The RF coil apparatus of claim 1, further comprising:
   an MRI magnet having a magnet bore, wherein the plurality of body-coil portions is coupled to the MRI magnet; and
   a support stand coupled to the plurality of body-coil portions, wherein the plurality of body-coil portions is removable from the MRI magnet.

10. The apparatus of claim 1, further comprising:
    a tune-and-match circuit on each respective one of the plurality of body-coil portions that is operatively coupled to the at least one RF coil element of the respective one of the plurality of body-coil portions;
    a plurality of electrically controllable circuits operable to change electrical parameters of the tune-and-match circuit of each one of the plurality of body-coil portions, wherein the plurality of electrically controllable circuits includes a feedback circuit configured to provide feedback signals that are used to automatically adjust the electrical parameters of the tune-and-match circuit.

11. The apparatus of claim 1, wherein the plurality of body-coil portions has eight body-coil portions, and wherein each one of the plurality of body-coil portions has four RF coil elements.

12. The apparatus of claim 1, wherein the apparatus has sixty-four RF coil elements.

13. The apparatus of claim 1, wherein the frame of each of the plurality of body-coil portions includes a plurality of cross-bar members.

14. A method for making a radio-frequency (RF) coil, the method comprising:
   forming a plurality of body-coil portions, each one of the plurality of body-coil portions having a frame having a concave inner face and a convex outer face;
   mounting at least one RF coil element to the frame of each one of the plurality of body-coil portions;
   operatively coupling at least one output RF power amplifier affixed to each of the at least one RF coil element to provide an RF transmit signal to the at least one RF coil element;
   RF shielding the convex outer face of the frame of each one of the plurality of body-coil portions;
   attaching each one of the plurality of body-coil portions to at least one neighboring body-coil portion; and
   providing circuitry on the RF coil, wherein the circuitry is configured to conduct RF transmit signals to and RF receive signals from the RF coil elements on a plurality of the plurality of body-coil portions.

15. The method of claim 14, further comprising operatively coupling at least one input RF preamplifier affixed to each of the at least one RF coil element of the plurality of body-coil portions to preamplify RF signals received by the at least one RF coil element.

16. The method of claim 14, further comprising:
   mounting a tune-and-match circuit on each respective one of the plurality of body-coil portions, wherein each tune-and-match circuit is operatively coupled to the at least one RF coil element of the respective one of the plurality of body-coil portions; and
   electrically controlling mechanical units that change electrical parameters of the tune-and-match circuit of each one of the plurality of body-coil portions.

17. The method of claim 14, further comprising:
   mounting a tune-and-match circuit on each respective one of the plurality of body-coil portions, wherein each tune-and-match circuit is operatively coupled to the at least one RF coil element of the respective one of the plurality of body-coil portions; and
   electrically controlling a plurality of electrically controllable circuits operable to change electrical parameters of the tune-and-match circuit of each one of the plurality of body-coil portions.

18. The method of claim 14, wherein the RF shielding includes partially overlapping a shield of each one of the plurality of body-coil portions with a shield of at least one neighboring body-coil portion.

19. The method of claim 14, wherein the RF shielding includes using a plurality of partially overlapped staggered conductors on opposite faces of a dielectric substrate structure.

20. The method of claim 14, further comprising:
   using the RF coil element as a heat-dissipation device for the at least one RF power amplifier to which it is affixed, and
   connecting at least one RF preamplifier to each of a plurality of the RF coil elements.

21. The method of claim 14, further comprising:
   coupling the plurality of body-coil portions to an MRI magnet having a magnet bore.

22. The method of claim 14, further comprising:
   providing a support stand;
   coupling the plurality of body-coil portions to an MRI magnet having a magnet bore; and
   coupling the support stand to the plurality of body-coil portions such that the plurality of body-coil portions is removable from the MRI magnet.

23. The method of claim 14, further comprising:
   mounting a tune-and-match circuit on each respective one of the plurality of body-coil portions, wherein each tune-and-match circuit is operatively coupled to the at least one RF coil element of the respective one of the plurality of body-coil portions, wherein the tune-and-match circuit includes a feedback circuit; and
   automatically adjusting electrical parameters of the tune-and-match circuit based on feedback signals generated by the feedback circuit.

24. The method of claim 14, wherein the plurality of body-coil portions is eight body-coil portions, and wherein the at least one RF coil element is four RF coil elements.

25. The method of claim 14, wherein the RF coil has sixty-four RF coil elements.

26. The method of claim 14, wherein the frame of each of the plurality of body-coil portions includes a plurality of cross-bar members.

27. A radio-frequency (RF) coil apparatus for transmitting and/or receiving RF signals suitable for magnetic-resonance imaging (MRI), the apparatus comprising:
   means for forming a plurality of body-coil portions, each one of the plurality of body-coil portions having a frame having a concave inner face and a convex outer face;
   means for mounting at least one RF coil element to the frame of each one of the plurality of body-coil portions;
   means for operatively coupling at least one output RF power amplifier affixed to each of the at least one RF coil element to provide an RF transmit signal to the at least one RF coil element;
   means for RF shielding the convex outer face of the frame of each one of the plurality of body-coil portions;
   means for attaching each one of the plurality of body-coil portions to at least one neighboring body-coil portion; and
   means for transmitting RF signals to and receiving RF signals from the RF coil elements in a plurality of the plurality of body-coil portions.

28. The apparatus of claim 27, further comprising at least one input RF preamplifier affixed to each of the at least one RF coil element of the plurality of body-coil portions to preamplify RF signals received by the at least one RF coil element.

29. The apparatus of claim 27, further comprising:
   a tune-and-match circuit on each respective one of the plurality of body-coil portions, wherein each tune-and-match circuit is operatively coupled to the at least one RF coil element of the respective one of the plurality of body-coil portions; and
   means for electrically controlling mechanical units that change electrical parameters of the tune-and-match circuit of each one of the plurality of body-coil portions.

30. The apparatus of claim 27, further comprising:
   a tune-and-match circuit on each respective one of the plurality of body-coil portions, wherein each tune-and-match circuit is operatively coupled to the at least one RF coil element of the respective one of the plurality of body-coil portions; and
   means for electrically controlling a plurality of electrically controllable circuits operable to change electrical parameters of the tune-and-match circuit of each one of the plurality of body-coil portions.

31. The apparatus of claim 27, wherein the means for shielding includes at least one shield on each one of the plurality of body-coil portions that is partially overlapped with a shield of at least one neighboring body-coil portion.

32. The apparatus of claim 27, further comprising:
  means for using the RF coil element of each of the plurality of body-coil portions as a heat-dissipation device for the at least one RF power amplifier to which it is affixed, and
  means for connecting at least one RF preamplifier to each of a plurality of the RF coil elements.

* * * * *